US007178124B1

(12) United States Patent
Makarov et al.

(10) Patent No.: US 7,178,124 B1
(45) Date of Patent: Feb. 13, 2007

(54) METHODS, ALGORITHMS, SOFTWARE, ARCHITECTURES AND SYSTEM FOR PLACING CLOCKED COMPONENTS AND ROUTING TIMING SIGNALS IN A CIRCUIT AND/OR LAYOUT

(75) Inventors: Mikhail Makarov, Moscow (RU); Igor Chourkin, Moscow (RU); Mikhail Komarov, Moscow (RU); Boris Ginzburg, Santa Clara, CA (US)

(73) Assignee: Golden Gate Technology, Inc., San Jose, CA (US)

( * ) Notice: Subject to any disclaimer, the term of this patent is extended or adjusted under 35 U.S.C. 154(b) by 501 days.

(21) Appl. No.: 10/452,811

(22) Filed: May 30, 2003

(51) Int. Cl.
*G06F 17/50* (2006.01)

(52) U.S. Cl. .............................. 716/12; 716/9; 716/11; 716/14

(58) Field of Classification Search .................... 716/2, 716/9, 11, 12, 14
See application file for complete search history.

(56) References Cited

U.S. PATENT DOCUMENTS 5,638,291 A 6/1997 Li et al.
5,784,600 A 7/1998 Doreswamy et al.
5,918,058 A 6/1999 Budd
5,974,245 A 10/1999 Li et al.
5,987,086 A 11/1999 Raman et al.
6,145,117 A 11/2000 Eng
6,418,552 B1 7/2002 Osborn
6,434,731 B1 8/2002 Brennan et al.
6,785,873 B1 * 8/2004 Tseng ............................ 716/4

OTHER PUBLICATIONS

Blast ChipTM 3.0 User Guide, Magma Design Automation Inc., Cupertino CA, pp. 14-1-14-51.
Blast ChipTM 3.0 User Guide, Magma Design Automation Inc., Cupertino CA, pp. 14-1-14-51.

* cited by examiner

*Primary Examiner*—Thuan Do
(74) *Attorney, Agent, or Firm*—Andrew D. Fortney

(57) ABSTRACT

A method, algorithm, software, architecture and system for placing circuit components and routing wires. The method and algorithm generally include (a) placing components in an array of allowed locations, wherein each of the components receives a clock signal and each of the allowed locations is about the same distance from a first nearest neighbor along at least a first axis as are other allowed locations along said first axis, and (b) one of the following: (i) independently routing a plurality of combinational paths from at least two components to at least two other components, (ii) routing the clock signal to the components, or both (i) and (ii). The present method, algorithm, software, architecture and system advantageously reduce power and/or current consumption in integrated circuits, improve uniformity of timing for signal paths between clocked circuit components, and/or ensure that timing requirements for signal paths between clocked circuit components are met automatically.

46 Claims, 13 Drawing Sheets

700
710 Receive / Enter Input Data
720 Determine F-arc Boundary Condition
725 Determine and Allocate Allowed Locations for Components Receiving Timing Signal
730 Place Components Receiving Timing Signal(s) in Allowed Locations
740 Route Clock Tree
750 Place Circuit Elements and Route Wires, Disallowing any F-arc that Exceeds Boundary Condition
760 All Component-to-Component F-arcs Possible?
No
Yes
Done 250
312aa
312ab
312ac
312ad
211
212
213
214
312ba
312bb
312bc
312bd
219
220
221
222

METHODS, ALGORITHMS, SOFTWARE, ARCHITECTURES AND SYSTEM FOR PLACING CLOCKED COMPONENTS AND ROUTING TIMING SIGNALS IN A CIRCUIT AND/OR LAYOUT

FIELD OF THE INVENTION

The present invention generally relates to the field of circuit design, particularly integrated circuit design. More specifically, embodiments of the present invention pertain to methods, algorithms, software, systems and architectures for placing circuit components that receive a timing signal in a layout or floor plan, for reducing timing skew in an integrated circuit, and/or for reducing power and/or current consumption in an integrated circuit.

DISCUSSION OF THE BACKGROUND

Traditionally, in the field of integrated circuit design, the length of time that a signal takes to go from a predetermined origin to a predetermined destination (herein, generally referred to as "timing") is an important parameter. Integrated circuit designers typically include contributions from (1) transistors and/or other circuit devices (such as capacitors, resistors, diodes, etc.) and (2) wires when predicting or evaluating the timing of a particular design. As lines widths and device dimensions decrease, the relative contributions of wires to timing increase. At or below minimum or critical dimensions of 0.18 microns, wires become the major or dominant contributor to delays in timing.

Integrated circuits also generally have timing, or "clock," circuitry thereon. Such timing circuitry generally ensures that signals are captured at predetermined locations on the chip at certain times. The times at which certain circuit components capture data in the signals is generally defined by the clock signal waveform and the distribution of the clock signal to component locations on the chip.

Place and route software is generally used by integrated circuit designers to place circuit structures and/or configure wiring in a design automatically or semi-automatically. One typical challenge for place and route software has been to place circuit components (e.g., transistors, capacitors, diodes, logic gates, flip-flops, latches, registers, etc.) in a manner leaving sufficient room for wires to interconnect them. A number of such software tools are available in the marketplace today. However, such commercially available tools generally do not distinguish between clocked circuit components, such as flip-flops, latches and registers, and combinational circuit elements that do not receive a clock signal, such as switches and logic gates. Consequently, such tools generally do not ensure, or "guarantee by design," timing of signal paths from any clocked circuit component to the next downstream clocked circuit component. Rather, timing in a design is generally met by iteratively designing circuitry, then analyzing or determining the timing of various signal paths through the circuitry, and changing the design to shorten the signal paths that violate certain predetermined timing constraints or parameters.

For example, in at least one conventional clock tree synthesis (CTS) tool, buffers placed in locations in a clock tree layout specified by the tool force the relocation of other circuit structures that may have already been placed in those locations. That first relocation exercise is likely to result in further relocations of structures residing in locations where the relocated structures are placed, and so on, until all existing structures are relocated in allowable, unoccupied locations. In a design that includes about 100K flip-flops, the conventional CTS tool places about 20K clock buffers in the layout. It is not unusual for the placement of those 20K buffers to affect the locations of about 200K cells in the layout.

The ever-increasing demands on integrated circuit designers and manufacturers to create chips of increasing density, decreasing wire and transistor widths, and decreasing power supply and power consumption make it increasingly difficult, if not impossible, to ensure meeting timing constraints automatically or "by design." Increasing the complexity, flexibility and/or functionality of the circuitry on a chip exacerbates these challenges. Thus, what is needed is a tool with which integrated circuit designers can ensure timing of signals from any given origin to any given destination in a circuit.

SUMMARY OF THE INVENTION

Embodiments of the present invention relate to methods, algorithms, software, architectures and/or systems for placing clocked components and routing timing signals in a circuit and/or layout. The present invention advantageously improves uniformity of timing for signal paths between clocked circuit components (such as flip-flops and/or registers) and provides such uniformity automatically, or "by design." In certain embodiments, the invention reduces power and/or current consumption, improves timing between circuit blocks and/or clock domains on an integrated circuit, enables use of generally slower clocks to provide similar functionality and/or performance relative to existing methods and tools, and/or reduces the total number of circuit elements and/or components in a design.

These and other advantages of the present invention will become readily apparent from the detailed description of preferred embodiments below.

BRIEF DESCRIPTION OF THE DRAWINGS

FIG. 12 is another exemplary chip layout, showing a number of functional areas, or tiles, on the chip, many of which include a clock tree and clocked circuit components in accordance with the present invention.

DETAILED DESCRIPTION OF THE PREFERRED EMBODIMENTS

Figure 1:
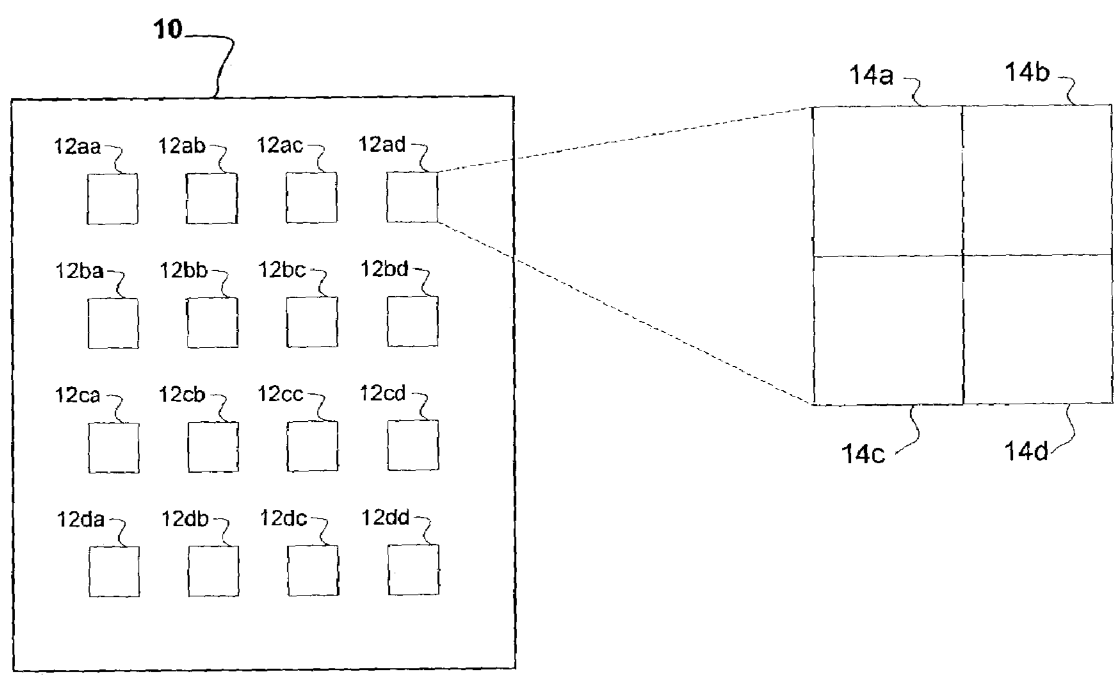
FIG. 1 is a box diagram showing an exemplary embodiment of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on code, data bits, data streams or waveforms within a computer, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like, and to their representations in computer programs or software as code (which may be object code, source code or binary code).

It should be borne in mind, however, that all of these and similar terms are associated with the appropriate physical quantities and/or signals, and are merely convenient labels applied to these quantities and/or signals. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer or data processing system, or similar processing device (e.g., an electrical, optical, or quantum computing or processing device), that manipulates and transforms data represented as physical (e.g., electronic) quantities. The terms refer to actions and processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, in the context of this application, the terms "net list" and "hardware description" may be used interchangeably to refer to a circuit design represented in an appropriate language, such as VERILOG, HDL or VHDL. Similarly, the terms "wire," "wiring," "line," "signal," "conductor" and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Similarly, for convenience and simplicity, the terms "clock," "time," "timing," "rate," "period" and "frequency" are, in general, interchangeable and may be used interchangeably herein, but are generally given their art-recognized meanings. Also, for convenience and simplicity, the terms "data," "data stream," "waveform" and "information" may be used interchangeably, as may (a) the terms "flip-flop," "latch" and "register," (b) the terms "layout" and "floor plan," and (c) the terms "connected to," "coupled with," "coupled to," and "in communication with," but these terms are generally given their art-recognized meanings herein. The terms "chip" and "integrated circuit" are also used interchangeably herein, but the term "chip" generally means a monolithic integrated circuit, whereas the generic tem "integrated circuit" is not necessarily so limited.

The present invention concerns a method and/or algorithm (e.g., part of a computer-readable set of instructions) for placing circuit components and routing wires, comprising the steps of (a) placing components in an array of allowed locations in a floor plan corresponding to a circuit, wherein each of the components receives a clock signal and each of the allowed locations is about the same distance from one or more nearest neighbors along at least a first axis as are other allowed locations along the first axis; and (b) independently routing a plurality of combinational paths from at least first and second of the components to at least third and fourth of the components. In preferred embodiments, each allowed location is also about the same distance from one or more nearest neighbors along a second axis as are other such allowed locations.

In a further aspect of the invention, the method relates to placing components in an array of allowed locations as described above then routing the clock signal to the components.

In a further aspect of the invention, the method relates to reducing power and/or current in an integrated circuit, in which the method generally comprises the steps of (a) placing components in an array of allowed locations as described above, (b) routing the clock signal to the components along a clock tree comprising a plurality of clock paths from an origin of the clock tree to one of the allowed locations, each of the clock paths having a length within a range of from $x-y$ to $x+y$, where x is a predetermined length and y is the distance from the allowed location to the first nearest neighbor, and (c) independently routing a plurality of combinational paths from at least a first plurality of the components to at least a second plurality of the components.

In a further aspect of the invention, the software relates to a medium or waveform containing a computer-readable set of instructions, where the instructions are configured to carry out one or more of the above methods. In an even further aspect of the invention, the system comprises a general purpose computer or workstation that includes the present software and is configured to execute the steps of the present method(s) and/or algorithm(s).

In a further aspect of the invention, the chip or circuit layout comprises (a) a plurality of components in an array of allowed locations in said layout, wherein each of said components receives a clock signal and each of said allowed locations is about the same distance from a first nearest neighbor along at least a first axis as are other allowed locations along said first axis; and (b) (i) a plurality of combinational paths from at least first and second of said components to at least third and fourth of said components, (ii) a clock tree electrically coupled to said components and providing said clock signal, said clock tree comprising a plurality of clock paths from an origin of said clock tree to one of said allowed locations, and each of said clock paths having a length of from x−y to x, where x is a predetermined clock path length and y is the distance from the allowed location to the first nearest neighbor, or (iii) both (i) and (ii).

The invention further relates to hardware and/or software implementations of the present methods, algorithms and layouts. The invention, in its various aspects, will be explained in greater detail below with regard to exemplary embodiments.

EXEMPLARY IMPLEMENTATIONS OF THE INVENTION

In one aspect, the present invention relates to various methods of placing clocked circuit components in a regularly-spaced array of allowed locations and routing wires between such components and other structures. In different embodiments, the method concerns placing clocked components in an array of allowed locations, each of which is about the same distance from a first nearest neighbor as are other allowed locations along the same axis, and at least one of the following: (1) routing a plurality of combinational paths between the components, and/or (2) routing the clock signal to the components. The invention also relates to algorithms and/or software for practicing the various methods, a computer system including the software, circuit and/or chip layouts embodying the inventive concepts, and methods of manufacturing integrated circuits incorporating one or more aspects of the inventive concepts disclosed herein. The various embodiments of the invention shall be further illustrated by reference to specific embodiments, which are for illustration of the invention, and are not to be taken as limiting the invention except as defined in the accompanying claims.

In general, component and signal/bus numbers common to two or more figures reflect the suitability of the same structures, signals and/or functions for both of the exemplary embodiments. However, these examples do not require that the same component(s), signal(s), bus(ses) and/or function(s) be used or implemented in both examples, other than as specifically described herein.

First Exemplary Embodiment

In a first embodiment, the invention relates to a method of placing and routing, comprising the steps of (a) placing components in an array of allowed locations in a floor plan corresponding to a circuit, wherein each of the components receives a clock signal and each of the allowed locations is about the same distance from a first nearest neighbor along at least a first axis as are other allowed locations along the first axis; and (b) independently routing a plurality of combinational paths from at least first and second of the components to at least third and fourth of the components. Thus, the array of allowed locations comprises at least a 2-by-2 array, and preferably comprises an x-by-y array, where x and y are independently an integer of at least 4. More preferably, the array of allowed locations comprises a $2^n$-by-$2^m$ array, where n and m are independently an integer of at least 2, and even more preferably, at least 3.

FIG. 1 shows a greatly simplified chip or circuit block layout or floor plan 10 having a 4-by-4 array of allowed locations 12*aa*–12*dd*, in which circuit components receiving a clock signal (i.e., "clocked circuit components") may be placed. The allowed locations in FIG. 1 are not drawn to scale, but rather, are greatly oversized to illustrate the invention. Allowed location 12*ad* is expanded to show 4 sublocations 14*a*–14*d* in which a clocked circuit component may be placed. A clocked circuit component may be placed in any, all or none of the sublocations 14*a*–14*d*. Consequently, up to 4 clocked circuit components may be placed in each of allowed locations 12*aa*–12*dd*. Of course, the allowed locations 12*aa*–12*dd* may have any number of sublocations, preferably from 1 to an a-by-b array (a and b independently being an integer of from 1 to 10, more preferably from 1 to 4, and when one of a and b is 1, the other is 2 or more). Four sublocations, in a 2-by-2 array, is generally a preferred implementation for an allowed location.

Circuit components receiving a clock signal are generally any circuit or device configured to operate under the control of, or in response to, a clock signal. Such clocked circuit components may be edge- or voltage level-controlled or -triggered, and may be the same or different in each allowed (sub)location. Preferably, however, the clocked components placed in a given allowed location are the same, as may be clocked components placed in allowed locations along first and second border axes of the array (e.g., allowed locations 12*aa*–12*da* and 12*ad*–12*dd*). Examples of suitable circuit components include storage or memory components, such as a flip-flop, a latch or a register; switches or gates, such as a transistor configured to receive the clock signal at its gate; a counter; a synchronous adder or subtractor; a divider or multiplier; parallel combinations thereof, etc. Preferably, circuit components receiving a clock signal comprise a flip-flop, a latch or a register.

Clocked circuit components in a given array of allowed locations generally receive the same clock signal. However, the clock signal need not be the same signal for all timing-controlled components in an array. A logical equivalent of the clock signal (e.g., an integer multiple and/or divisor thereof, complement thereof, etc.) can be supplied to one or more components within a given array or block of circuitry. In other words, the invention concerns regularly spacing clocked circuit components within a common clock domain.

In the present invention, allowed locations are placed along at least a first axis about the same distance from a first nearest neighbor. For example, in FIG. 1, axes may be defined by a "row" or "column" of allowed locations in the array (e.g., row 12*ax*, including allowed locations 12*aa*–12*ad*; or column 12*xa*, including allowed locations 12*aa*–12*da*). In the simplest example, allowed location 12*ab* is placed in row 12*ax* about the same distance from its first nearest neighbor 12*aa* as allowed location 12*ad* is from its first nearest neighbor 12*ac*. In the embodiment of FIG. 1, allowed location 12*ab* is also about the same distance from allowed location 12*ac* as it is from allowed location 12*aa*, and likewise, allowed location 12*ac* is about the same distance from allowed location 12*ab* as it is from allowed location 12*ad*. Thus, as is shown in FIG. 1, either of allowed locations 12*aa* or 12*ac* can be a "first nearest neighbor" to allowed location 12*ab*, and either of allowed locations 12*ab* or 12*ad* can be a "first nearest neighbor" to allowed location 12*ac*. Although it is preferred that an allowed location having two nearest neighbors along an axis be about the same distance from both nearest neighbors, this is not a requirement.

Furthermore, in a preferred embodiment, each of the allowed locations is about the same distance from a second nearest neighbor along a second axis as are other allowed locations along the second axis. For example, in a second axis defined by column 12*xa* in FIG. 1, allowed location 12*ba* is placed about the same distance from its first nearest neighbor 12*aa* as allowed location 12*da* is from its first nearest neighbor 12*ca*. However, with respect to allowed location 12*aa*, allowed location 12*ab* is a first nearest neighbor along the row axis, and allowed location 12*ba* is a second nearest neighbor along the column axis. Thus, the invention encompasses regular spacing(s) between allowed locations for clocked circuit components in two dimensions. Typically, the "nearest neighbor" distance along one axis will not be the same as the "nearest neighbor" distance along the other axis, although they can be same if so desired. Furthermore, although FIG. 1 shows a preferred implementation where the two dimensions are at right angles to one another, this is also not a requirement, and the first and second axes can be at any angle with respect to each other that allows regular spacing of allowed locations.

The inventive method further encompasses regular spacing(s) between allowed locations along parallel axes in the array. Thus, each of the allowed locations along a plurality of parallel first axes may be placed about the same distance from its first nearest neighbor as are other allowed locations along any of the parallel first axes. For example, as shown in FIG. 1, a second row 12*bx* defined by allowed locations 12*ba*–12*bd* is approximately parallel to row 12*ax*. Allowed location 12*bb* is about the same distance from allowed location 12*ba* along axis 12*bx* as allowed location 12*ab* is from allowed location 12*aa* along axis 12*ax*.

Furthermore, in a preferred implementation, the method encompasses regular spacing(s) between allowed locations along parallel axes in two dimensions in the array. Thus, each of the allowed locations along a first plurality of parallel first axes and along a second plurality of parallel second axes may be placed about the same distance from its first nearest neighbor along the first axis and about the same distance from its second nearest neighbor along the second axis as are other allowed locations along any of the parallel axes. For example, as shown in FIG. 1, a second column row 12*xb* defined by allowed locations 12*ab*–12*db* is approximately parallel to column 12*xa*. Allowed location 12*bb* is about the same distance from allowed location 12*ab* along axis 12*xb* as allowed location 12*ba* is from allowed location 12*aa* along axis 12*xa*. By doing so, the array of allowed locations 12 may be represented by a two-dimensional pattern having regular spacing(s) between at least subsets of allowed locations.

Figure 2:
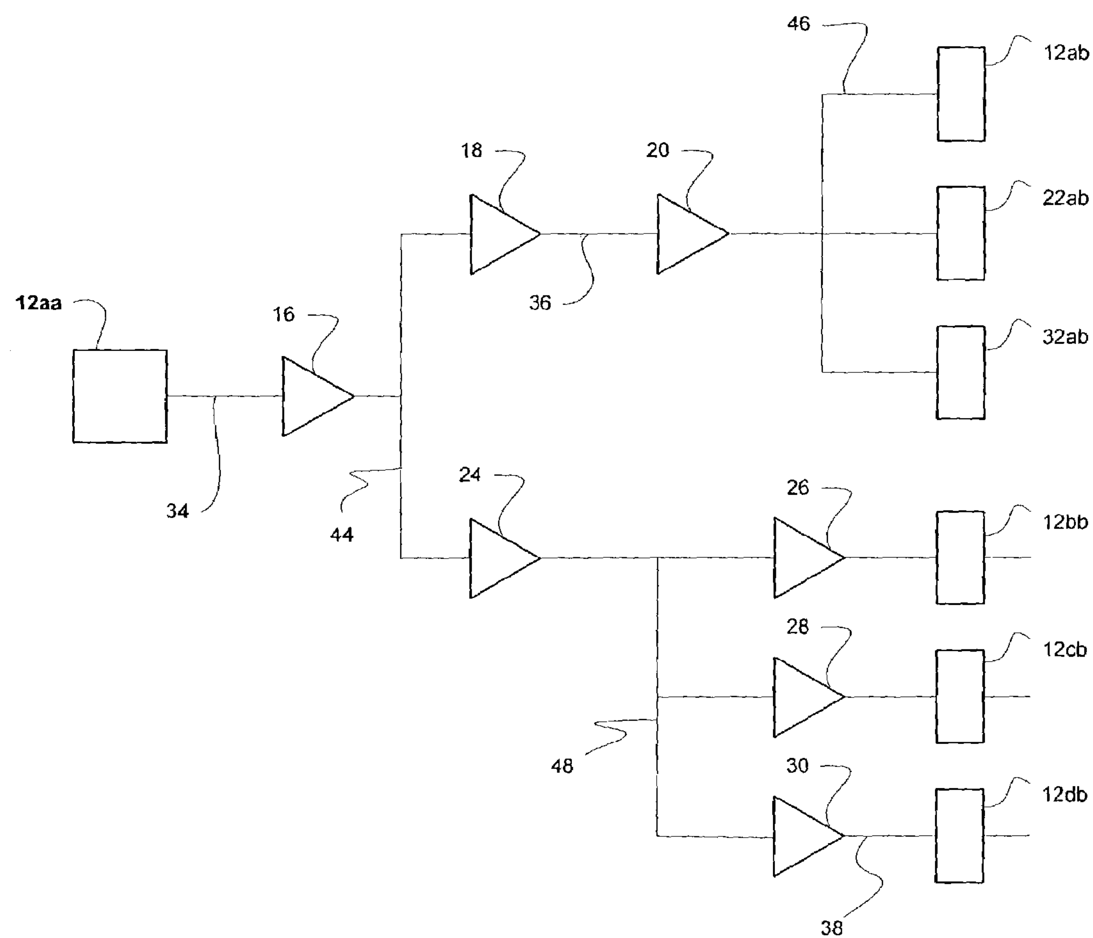
FIG. 2 is a simplified circuit diagram for illustrating an exemplary embodiment of the present invention.

The method further includes the step of independently routing a plurality of combinational paths from at least first and second of the clocked components to at least third and fourth of the clocked components. Referring to FIG. 2, combinational circuit elements 16, 18, 20, 24, 26, 28 and 30 are placed between clocked circuit components in two adjacent allowed locations (e.g., 12*aa* and 12*ab*). Any signal and/or data path in FIG. 2 between first clocked component 12*aa* and one of the other clocked components 12*ab*, 22*ab*, 32*ab*, 12*bb*, 12*cb* or 12*db* is a simple example of an F-arc. Generally, an "F-arc" is considered herein to be a signal path having two components at its endpoints and a series of alternating wires and combinational circuit elements between the two components, where the components receive a common clock signal (e.g., the same clock or logically equivalent clocks). For more details relating to F-arcs and further examples thereof, see U.S. patent application Ser. No. 10/449,757, filed on May 30, 2003, and entitled "Method, Software and System for Ensuring Timing Between Clocked Components in a Circuit," the entirety of which is incorporated herein by reference.

Each component generally has one or more combinational paths routed to and/or from it. Preferably, components in an allowed location in the perimeter of an array have one or more combinational paths routed thereto (e.g., from another component within the array) or therefrom (e.g., to another component within the array), and components in allowed locations in the interior of an array have one or more first combinational paths routed thereto and one or more second combinational paths routed therefrom.

Combinational circuit elements 16, 18, 20, 24, 26, 28 and 30 are shown in FIG. 2 as buffers, but generally, they may be any circuit or device not configured to receive a clock signal. Suitable examples include an inverter or a buffer (e.g., an even-numbered series of inverters, typically 2 inverters in series, which may be 3-statable or configured to be placed in a "high z" state); a switch or transistor receiving a control signal (other than a clock) at its gate; a logic gate (such as an AND, OR, NAND, NOR, or XOR gate); a multiplexer or demultiplexer; a comparator, encoder or decoder; an combinational adder or subtractor; parallel or serial combinations thereof; etc. While the invention encompasses combinational paths having at least one circuit element therein, preferably the combinational paths include at least 3 combinational circuit elements (each of which may be independently selected), and more preferably at least 5 independently selected combinational circuit elements. Furthermore, in preferred implementations of the method, at least three of the combinational elements comprise a buffer. While the upper limit of combinational circuit elements is constrained only by the design and fabrication technology available, typical upper limits in a 0.15 or 0.18 micron fabrication technology and design are on the order of 15–20 such circuit elements.

In the method, the combinational paths preferably each comprise n wires and (n−1) combinational elements, where n is an integer of at least 2, preferably at least 3, more preferably at least 5. In this case, the method further comprises placing the combinational elements in the floor plan, and independently routing the wires between the combinational elements and/or between the components and the combinational elements. Such wires may be unbranched (e.g., wires 34, 36 or 38 in FIG. 2) or branched (e.g., wires 44, 46 or 48 in FIG. 2).

The length of wires has upper and lower limits constrained only by the design and fabrication technology available. However, typical lower limits in a 0.15 or 0.18 micron fabrication technology and design are on the order of 4× the minimum feature dimension of the immediately underlying layer (e.g., for a 0.15 micron wide transistor, a minimum length for the first layer of metal is about 0.6 microns), while typical upper limits in a 0.15 or 0.18 micron fabrication technology and design are on the order of about 1000 microns (preferably about 500 microns).

In especially preferred embodiments, the routing step of the present method comprises placing and routing each of the combinational paths such that no signal path in the circuit exceeds a boundary condition. In preferred implementations, the boundary condition comprises a maximum propagation time or a maximum length. Such boundary conditions are discussed at length in U.S. patent application Ser. No. 10/449,757. In other preferred implementations, placing comprises placing circuit elements and routing comprises routing wires between (i) such circuit elements, (ii) one or more clocked components and one or more circuit elements, and/or (iii) two or more clocked components. In certain embodiments, the method and/or algorithm may further include identifying, defining or specifying the boundary condition.

Figure 3:
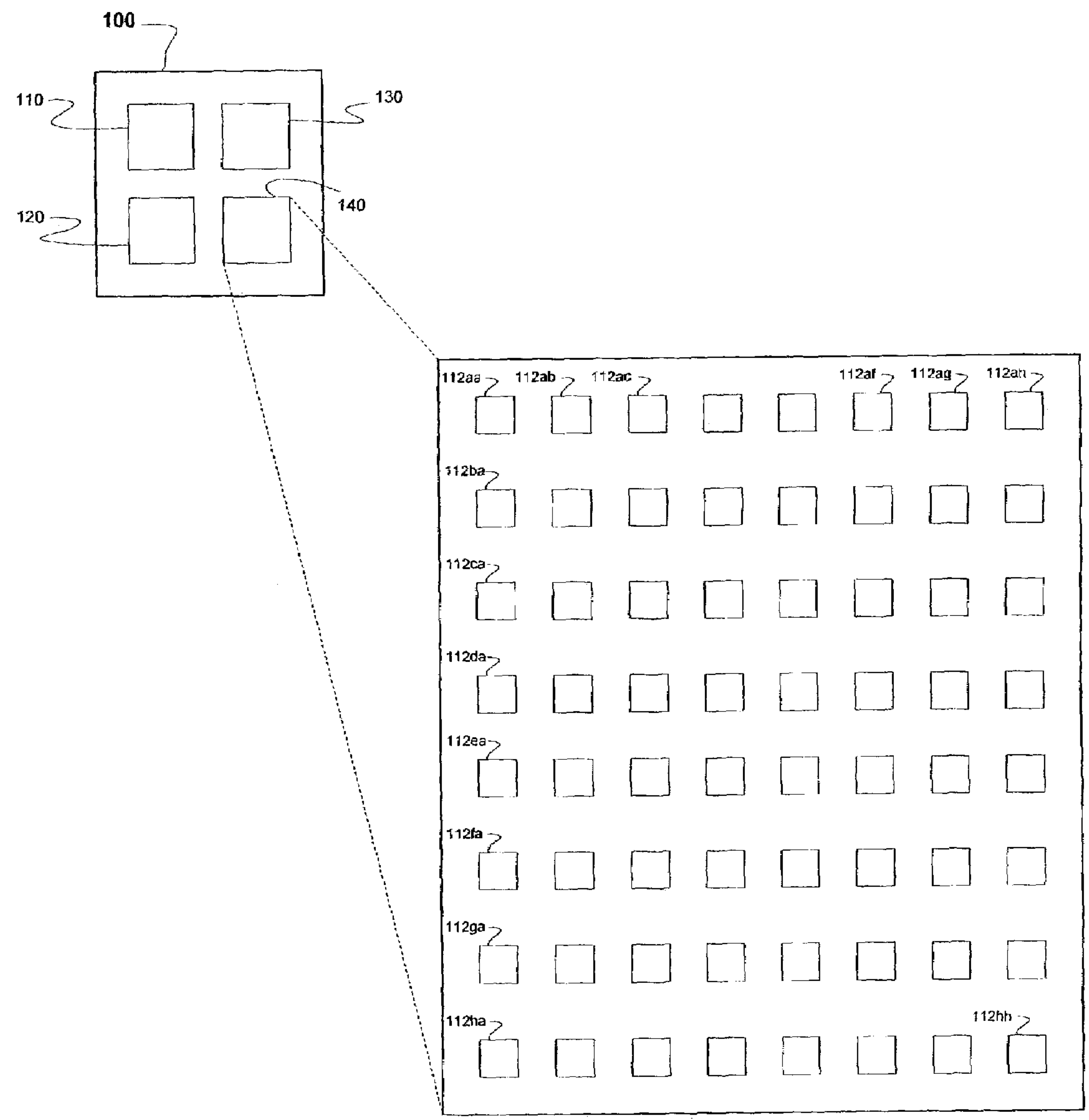
FIG. 3 is a box diagram showing a further exemplary embodiment of the present invention.

The invention further encompasses (i) regular spacing(s) of all allowed locations along a given axis and/or (ii) a multi-block chip or chip design (or multi-tile design within a circuit block), in which one or more of the blocks or tiles includes an array of allowed clocked circuit component locations in accordance with the invention. For example, FIG. 3 illustrates an exemplary chip layout 100 having a plurality of blocks 110, 120, 130 and 140 therein. Such blocks may represent a block of circuitry on the chip 100 providing one or more predetermined functions. Further, such blocks can be designed as an integral or discrete unit, having a plurality of defined inputs and a plurality of defined outputs, each in a predetermined location on the perimeter of the block. In an alternative implementation, a circuit block layout may comprise a plurality of tiles in an x-by-y array therein, where x and y are as defined above. Such tiles may represent a discrete circuit or sub-block of circuitry, and they may be the same or different as one or more other tiles in a block. Further, such tiles should have one or more defined inputs and one or more defined outputs, each in a predetermined location on the perimeter of the tile.

Preferably, each circuit block on a chip 100 having an array of clocked circuit components with combinational signal paths therebetween is laid out or designed using the present method. Therefore, it is not unusual for 2 or more, preferably 4 or more, blocks of circuitry on a single chip to have an array of allowed clocked circuit component locations in accordance with the invention. Generally, such blocks will provide a higher-level (e.g., synthesized) logic or data processing function, but they may provide other functions requiring accurate timing circuitry as well, such as memory storage and retrieval.

Furthermore, the invention preferably encompasses regular spacing(s) of all allowed locations along a given axis. Thus, each of the allowed locations in an array having a second nearest neighbor along the first axis (typically within the axis, rather than at an axis endpoint) is about the same distance from the second nearest neighbor along the first axis as is at least one other such allowed location. Preferably, the "second nearest neighbor" distance is the same for all such allowed locations along the first axis. However, in the simplest implementation, the distance between any two of the allowed locations along the first axis is about the same. For example, in FIG. 3, block 140 has been expanded to show an array of allowed locations 112*aa*–112*hh*. In a row 112*ax* defined by allowed locations 112*aa*–112*ah*, the distance between allowed locations 112*aa* and 112*ab* is about the same as the distance between allowed locations 112*ab* and 112*ac*, and so on along the allowed locations on axis 112*ax* to the distance between allowed locations 112*ag* and 112*ah*. In this case, either of allowed locations 112*aa* and 112*ac* can be a "first nearest neighbor" to allowed location 112*ab*, the other being either a "second nearest neighbor" or another "first nearest neighbor".

However, in the case where the distances differ between an allowed location and its 2 nearest neighbors along a given axis, each of the allowed locations in an array having a second nearest neighbor along the first axis is about the same distance from the second nearest neighbor as is at least one other such allowed location along the first axis (and preferably, all such allowed locations along the first axis). For example, as shown in FIG. 3, allowed location 112*ab* has first and second nearest neighbors 112*aa* and 112*ac*, and allowed location 112*ag* has first and second nearest neighbors 112*af* and 112*ah*. If the distance between allowed locations 112*aa* and 112*ab* differs from the distance between allowed locations 112*ab* and 112*ac*, one of allowed locations 112*aa* or 112*ac* will be the "first nearest neighbor" to allowed location 112*ab*, and the other will be the "second nearest neighbor" to allowed location 112*ab* along axis 112*ax*. Similarly, one of allowed locations 112*af* or 112*ah* will be the "first nearest neighbor" to allowed location 112*ag*, and the other will be the "second nearest neighbor." In this implementation, the distance between allowed location 112*ab* and its first nearest neighbor 112*aa* or 112*ac* will be the same as the distance between allowed location 112*ag* and its first nearest neighbor 112*af* or 112*ah*, and the distance between allowed location 112*ab* and its second nearest neighbor (the other of allowed locations 112*aa* or 112*ac*) will be the same as the distance between allowed location 112*ag* and its second nearest neighbor (the other of allowed locations 112*af* or 112*ah*). In this implementation, the first and second nearest neighbor distances will be same for all allowed locations that have two nearest neighbors along the axis (generally, the internal locations along thae axis, rather than the endpoints).

The present invention also encompasses regular spacings of allowed locations having first and second nearest neighbors along each of first and second axes. For example, in the simplest implementation, the distance between any two allowed locations along a first axis is about the same (e.g., a first distance apart), and the distance between any two allowed locations along a second axis is about the same (e.g., a second distance apart), although the two distances may differ. For example, in FIG. 3, each of allowed locations 112*aa*–112*ah* along row axis 112*ax* is equally spaced apart. Similarly, each of allowed locations 112*aa*–112*ha* along column axis 112*xa* is equally spaced apart. However, the distance between locations 112*aa* and 112*ab* is not necessarily about the same as the distance between locations 112*aa* and 112*ba*. Typically, these distances will not be the same. Furthermore, in the case where the distances differ between an allowed location and its 2 nearest neighbors along a first and second axes, each of the allowed locations having a second nearest neighbor along the first axis is about the same distance from the second nearest neighbor as is at least one other such allowed location along the first axis, and each of the allowed locations having a second nearest neighbor along the second axis is about the same distance from the second nearest neighbor as is at least one other such allowed location along the second axis. Preferably, the "second nearest neighbor" distances are the same for all such allowed locations along the first and second axes, but these "second nearest neighbor" distances along the two axes do not have to be the same as each other.

The present invention also encompasses regular spacings of allowed locations having one or two nearest neighbors along a plurality of parallel axes, in one or two dimensions. Thus, each of the allowed locations along a plurality of parallel first axes is about the same distance from a first nearest neighbor along a common first axis as are other allowed locations along any of the parallel first axes, and each of the allowed locations along a plurality of parallel second axes is about the same distance from a second nearest neighbor along a common second axis as are other allowed locations along any of the parallel second axes. For allowed locations having first and second nearest neighbors along one or two axes, each of the allowed locations along a plurality of parallel first axes having a second nearest neighbor on a common first axis may be about the same distance from the second nearest neighbor as is at least one other such allowed location along each of the parallel first axes, and/or each of the allowed locations along a plurality of parallel second axes having a second nearest neighbor on a common second axis is about the same distance from the second nearest neighbor as is at least one other such allowed location along each of the parallel second axes. Preferably, In further embodiments, the present method further comprises (i) routing the clock signal to the components (which will be explained in greater detail below in the second exemplary implementation), (ii) determining a maximum length of a combinational signal path between clocked components, and/or (iii) placing such components such that no combinational signal path in the circuit has a length exceeding the maximum length. Thus, the present invention may further determine or calculate an F-arc boundary condition, either empirically or from certain input data, then (a) place clocked components and combinational circuit elements and (b) route wires to form F-arcs such that any F-arc that exceeds the boundary condition is disallowed.

By placing clocked circuit components in an array of regularly spaced locations, the lengths of combinational signal paths between the clocked components can be made much more uniform than with conventional place-and-route tools that do not distinguish between clocked and combinational circuit structures. This result leads to a reduced number of buffers in combinational signal paths, improved timing within a tile, circuit block and/or chip, and further enables one to more reliably meet timing requirements "by design." In one implementation, this approach reduced the total number of buffers placed in combinational signal paths by 2- to 3-fold relative to conventional place-and-route tools optimized for input-output signal path lengths, thereby enabling reductions in (1) overall chip area and/or size, and/or (2) peak power and/or current consumption in the chip.

A Second Exemplary Embodiment

Another aspect of the invention relates to a method of routing a timing signal, comprising the steps of (a) placing components in an array of allowed locations in a floor plan corresponding to a circuit, wherein each of the components receives a clock signal and each of the allowed locations is about the same distance from a first nearest neighbor along at least a first axis as are other allowed locations along the first axis; and (b) routing the clock signal to the components. In this embodiment, step (a), placing clocked components, is essentially the same as in the first exemplary embodiment above. Therefore, the discussion below will focus on (i) routing the clock signal to the clocked components in the array and (ii) further details relating to exemplary placements of clocked components.

One further advantage provided by an array of regularly spaced clocked circuit components relates to uniform routing and/or distribution of timing signals within the array. One can intelligently and advantageously synthesize and/or route a clock tree that uniformly distributes a clock signal to each clocked component within the array, ensuring minimal clock skew across the array. Patterned arrays of allowed locations lend themselves well to synthesis of clock trees in which each clock signal path, from the origin of the clock tree to each destination at an allowed location, has about the same length, thereby providing a mechanism to ensure minimal clock skew across the array "by design."

Figure 4:
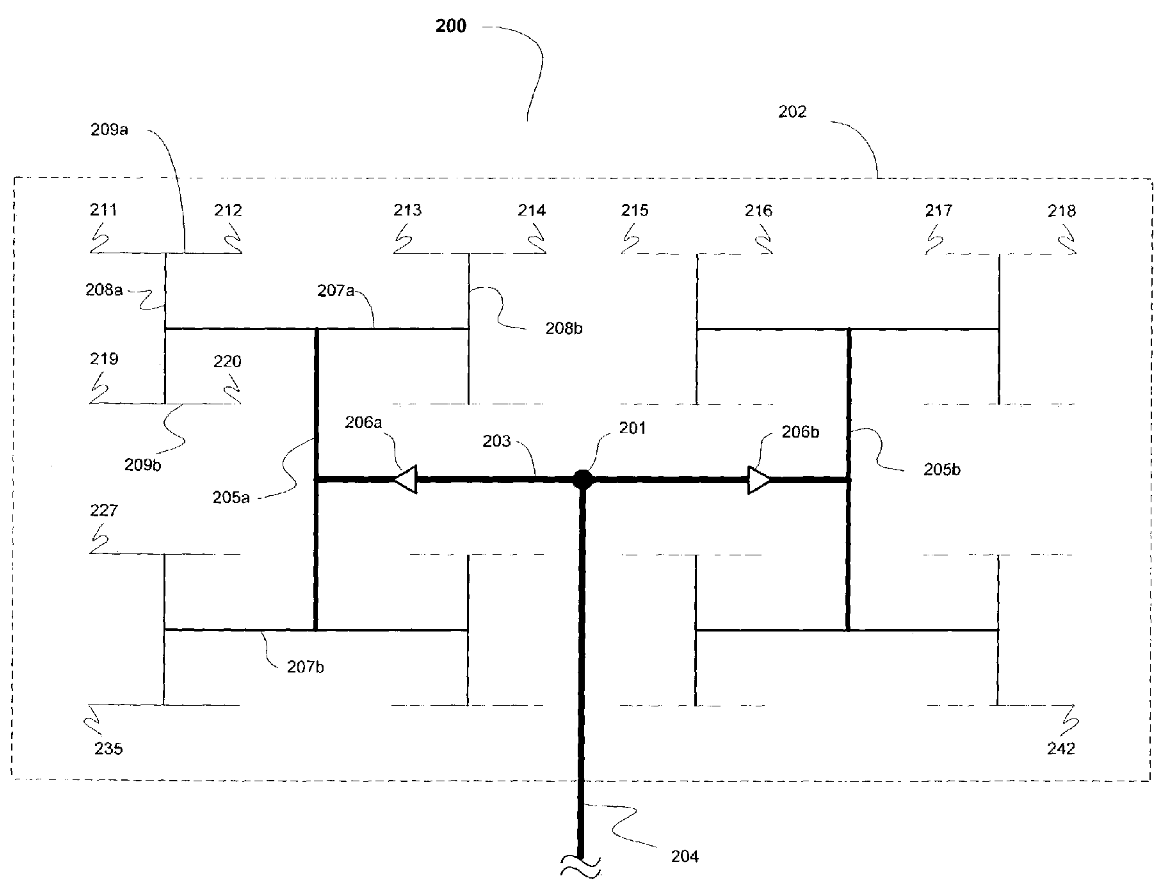
FIG. 4 is a diagram showing an exemplary clock tree implementable in the present invention.

FIG. 4 shows a simple clock tree 200, having an origin 201 and a plurality of destinations 211–242 to allowed locations in an array 202. Clock tree 200 provides a uniform clock signal to array 202. (For the sake of clarity, destinations 221–226, 228–234 and 236–241 are not numbered, and the allowed locations at each of destinations 211–242 are not shown.) An external clock signal (which may be generated off-chip or in another circuit block or tile on the chip) is supplied to array 202 along bus 204, which can be said to terminate at clock tree origin 201. The externally supplied clock signal is amplified (and optionally filtered) by buffers 206*a* and 206*b* as it is distributed to the two halves of clock tree 200. Such a layout is generally known to those skilled in the art as an "H tree."

The thicknesses of the lines in clock tree 200, while not absolute in any sense, generally depict different levels of the tree. For example, line 203, which contains the origin 201 and clock buffers 206*a* and 206*b*, represents the first level of the clock tree. However, this line physically comprises a plurality of wire segments, which may be at the same or different levels of metallization in the integrated circuit. External clock bus 204 may comprise a wire at a relatively high layer of metallization. At origin 201, a terminal of bus 204 may be electrically coupled by one or more interlayer contacts and/or layers of metallization to a wire or bus 203 in a relatively lower layer of metallization. Bus 203, which may comprise one or more wire segments electrically connected together by interlayer contacts, has terminals electrically coupled to inputs of buffers 206*a* and 206*b* through one or more additional contacts and/or layers of metallization. The outputs of buffers 206*a* and 206*b* may be coupled electronically through one or more additional contacts and/or layers of metallization to remainders of line 203. These remainders may be in the same metallization layer as the wire containing origin 201 or in a different layer of metallization. Another terminal of each remainder of line 203 may be directly coupled to wires 205*a* and 205*b* in the same layer of metallization, or may be electrically coupled by one or more contacts and/or layers of metallization to wires 205*a* and 205*b* in a different (preferably lower) layer of metallization than that of the line 203 remainder. In turn, the terminals of line 205*a* may be directly coupled to wires 207*a* and 207*b* in the same layer of metallization, or may be electrically coupled by one or more contacts and/or layers of metallization to wires 207*a* and 207*b* in a different (preferably lower) layer of metallization than that of wire 205*a*, and so on along the clock tree paths 208*a*–*b* and 209*a*–*b*, until the destinations (e.g., 211, 212, 219 and 220) are reached. To take greatest advantage of the inventive concept(s), preferably the same arrangement occurs at the terminals of lines 205*b*, 207*b* and 208*b* as occur at the terminals of lines 205*a*, 207*a* and 208*a*.

The invention is not limited to any particular number of levels in the clock tree, although it is preferred to have at least 3 levels, more preferably at least 5 levels, at a minimum. The maximum number of levels is generally determined by circuit design and manufacturing parameters, such as size and density of the array, allowed location spacing, frequency of the clock, length and resistivity of the wires and/or wire segments, allowable and/or maximum load(s) on the clock tree or clock tree segments, etc. Similarly, the number of clock buffers in the clock tree is not limited to any particular number or arrangement. However, in general, the smallest number of clock buffers necessary to effectively distribute the clock signal to the array will be employed. In a typical 0.15 micron minimum line width design, a buffer will be placed every 3 to 5 levels in the clock tree. Also, in general, the higher the clock tree level, the fewer the levels between clock buffers. For example, in an 8-level clock tree, two buffers may be placed near the ends of the top level, and another set of buffers may be placed near the ends of the fourth level from the top.

Figure 5A:
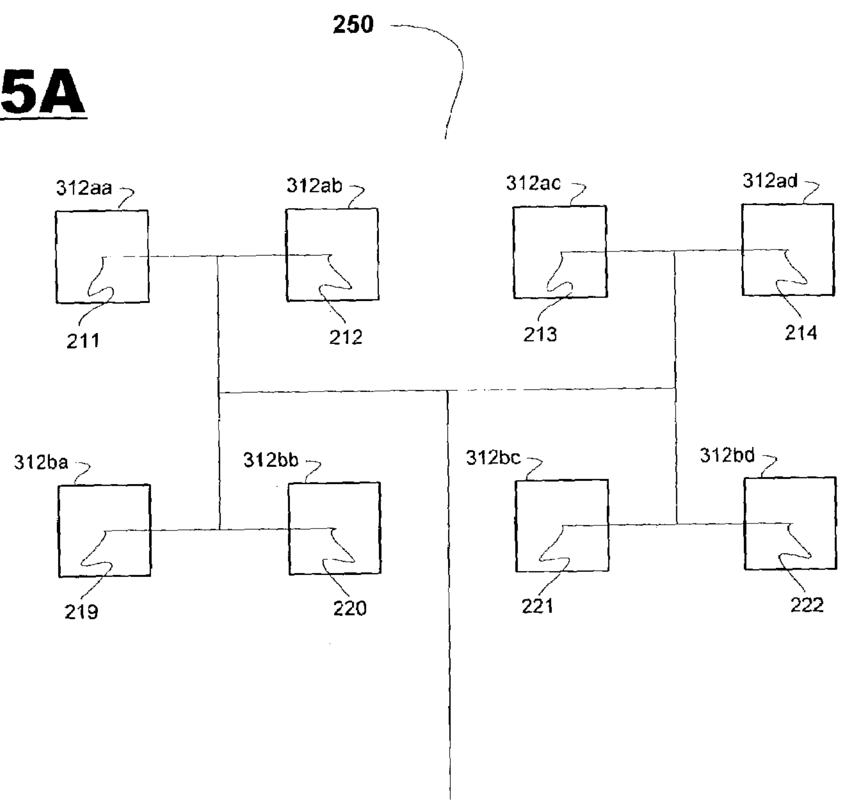
FIGS. 5A and 5B are diagrams respectively showing allowed component locations and placed components in one embodiment of the present invention.
Figure 5B:
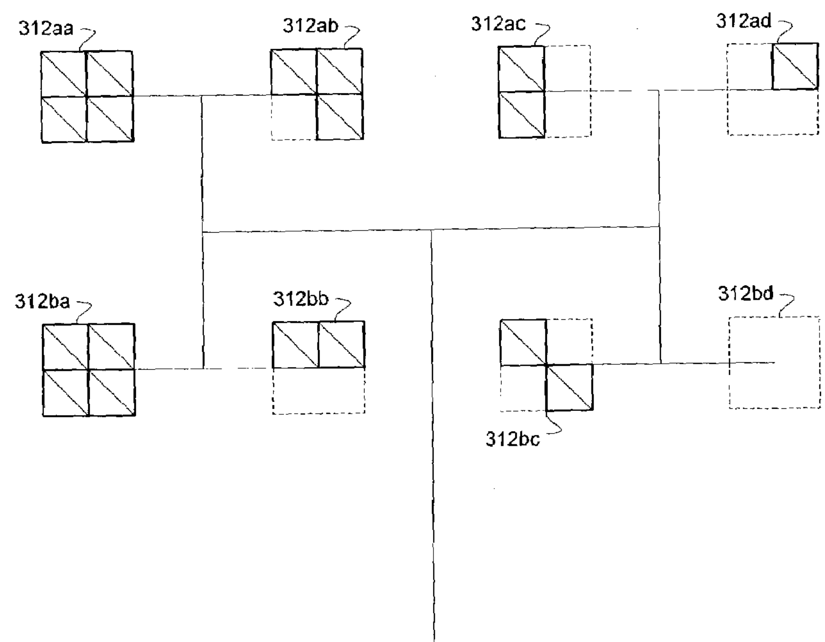

FIGS. 5A and 5B respectively show a portion 250 of clock tree 200 with allowed locations 312*ad*–312*bd* at clock tree destinations 211–214 and 219–222, and with clocked circuit components placed in one or more allowed component placement sublocations within a given allowed location, respectively. As explained above, each of allowed locations 312*ad*–312*bd* may comprise an array of allowed component placement sublocations (a so-called "leaf cell"). In the implementations shown in FIGS. 1 and 5B, each leaf cell comprises a 2-by-2 array of allowed component placement sublocations. A clocked component (represented by a flip-flop in FIG. 5B) may be placed in any of the allowed component placement sublocations.

In FIG. 5B, flip-flops have been placed in all 4 allowed component placement sublocations in allowed locations 312*aa* and 312*ba*. Flip-flops have been placed in 3 of the 4 allowed component placement sublocations in allowed location 312*ab* and in 2 of the 4 allowed component placement sublocations in allowed locations 312*bb*, 312*ac* and 312*bc*. When clocked components are placed in a subset of allowed component placement sublocations (wherein a plurality of allowed component placement sublocations are occupied, unoccupied, or both), such placement may be in adjacent sublocations (see allowed locations 312*bb* and 312*ac*) or non-adjacent sublocations (see allowed location 312*bc*) and may be on the same side of the clock tree bus (see allowed location 312*bb*) or opposite sides of the clock tree bus (see allowed locations 312*ac* and 312*bc*). A flip-flop has been placed in 1 of the 4 allowed component placement sublocations in allowed location 312*ad*, and no flip-flops at all have been placed in allowed location 312*bd*. While wires and/or busses from the clock tree destination to the individual gate(s) in the component receiving the clock signal can be designed and/or manufactured to minimize skew, any skew introduced into the clock wiring within a leaf cell is minimal or insignificant, and may be substantially no greater effect than that of random variations within design and/or manufacturing processes.

Figure 6A:
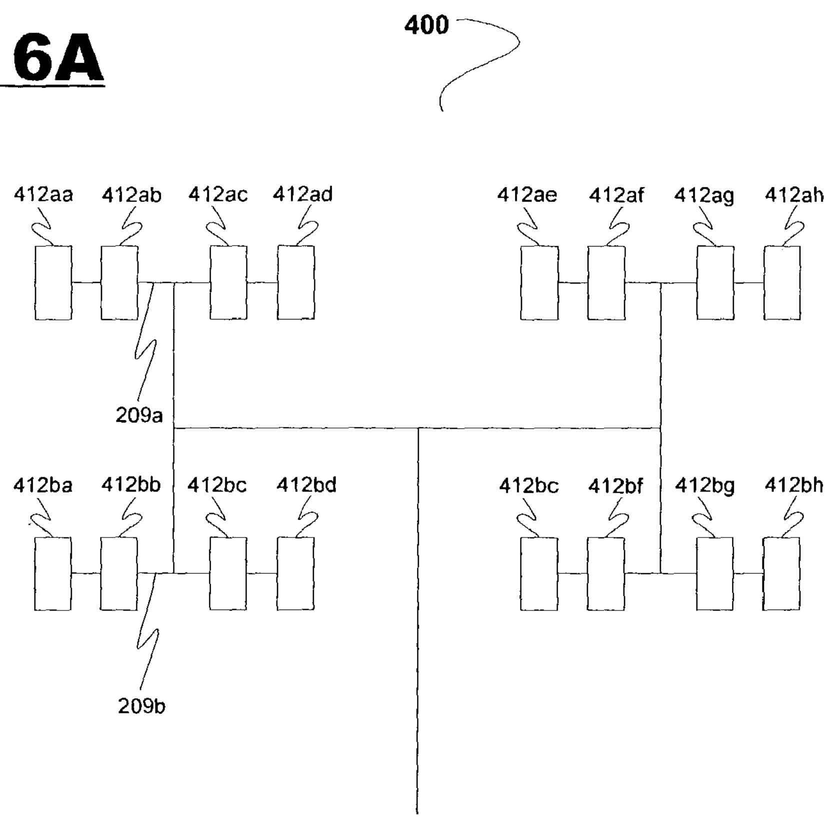
FIGS. 6A and 6B are diagrams respectively showing allowed component locations and placed components in an alternative embodiment of the present invention.
Figure 6B:
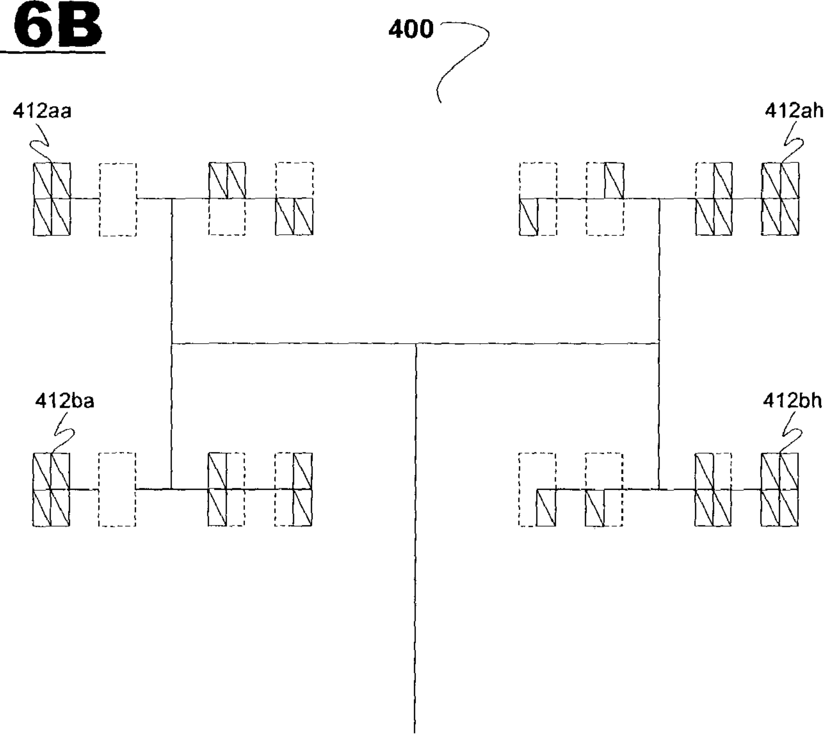

While approximately square allowed location and/or component sublocation shapes are shown in the exemplary layouts of FIGS. 1, 3, 5A and 5B, the invention is not so limited. FIG. 2, for example, shows rectangular allowed location shapes 12*ab*, 22*ab*, 32*ab*, 12*bb*, 12*cb*, and 12*db*. Furthermore, FIG. 6A shows rectangular allowed location shapes 412*aa*–412*bh*, and FIG. 6B shows 2-by-2 arrays of rectangular component sublocation shapes in rectangular allowed location shapes 412*aa*–412*bh*. While the rectangular (sub)location shapes in FIGS. 2, 6A and 6B have an aspect ratio (i.e., the ratio of the height of the shape to the width of the shape) of about 2:1, any aspect ratio of known placement/layout shapes for clocked components and arrays thereof is possible. In addition, placement and/or (sub) location shapes are not limited to squares and rectangles. For example, T-shaped or L-shaped locations and sublocations are also suitable, and such T- or L-shaped (sub)locations may be interlocking or non-interlocking.

FIG. 6A shows a portion 400 of an array of allowed locations in a layout, in which 2 allowed locations are placed along each branch of the lowest level of the clock tree. For example, 4 allowed locations are placed along lowest clock tree levels 209*a* and 209*b*, two along each branch. The locations follow the above spacing description(s). For example, along the row axis 412*ax* defined by allowed locations 412*aa*–412*ah*, allowed location 412*ab* is about the same distance away from its first nearest neighbor, allowed location 412*aa*, as allowed locations 412*ac*, 412*af* and 412*ag* are from their first nearest neighbors, allowed locations 412*ad*, 412*ae* and 412*ah*, respectively. Along the row axis 412*bx* defined by allowed locations 412*ba*–412*bh*, allowed locations 412*bb*, 412*bc*, 412*bf* and 412*bg* are about the same distance away from their first nearest neighbors, allowed locations 412*ba*, 412*bd*, 412*be* and 412*bh*, respectively, and that "first nearest neighbor" distance is about the same as the distance between the corresponding allowed locations in row 412*ax*.

Similarly, along row 412*ax*, allowed location 412*ab* is about the same distance away from its second nearest neighbor, allowed location 412*ac*, as allowed location 412*af* is from its second nearest neighbor, allowed location 412*ag*. In addition, along row 412*bx*, allowed locations 412*bb* and 412*bg* are about the same distance away from their second nearest neighbors, allowed locations 412*bc* and 412*bf*, respectively, and that "second nearest neighbor" distance is about the same as the distance between the corresponding allowed locations in row 412*ax*. However, allowed locations 412*ad* and 412*ae* have a "second nearest neighbor" distance between them that differs from the "second nearest neighbor" distance between allowed locations 412*ab* and 412*ac*. This spacing is acceptable in the present invention, as it will be reproduced in other portions of the clock tree that are designed and/or manufactured identically to portion 400. Thus, not all "second nearest neighbor" distances have to be identical, but, in general, all allowed locations along a given axis should have a "first nearest neighbor" distance that is the same as for the other allowed locations along the axis. When one expands, duplicates and/or replicates the array portion 400 of FIG. 6A to show or display a larger portion of the clock tree, one notices that the "nearest neighbor" spacing relationships described above also apply to allowed locations placed along the column axes.

In the case where two allowed locations are placed along each branch of the lowest level of the clock tree, the clock signal path lengths to these two allowed locations necessarily differ. However, this difference is generally negligible. For example, in a 7-level clock tree where the successive lower levels have a length three-fourths of the level above it, the additional distance to the allowed location at the terminal of the lowest level (relative to the allowed location at the internal position of the lowest level) is only about 1.8% of the overall clock signal path length. The percentage difference decreases dramatically as the clock tree levels increase and/or as the relative length of successive lower levels decreases. For example, a 9-level clock tree where the successive lower levels have a length two-thirds of the level above it, but where the lowest level has a length 80% of the next-to-lowest level, the additional distance to the allowed location at the terminal of the lowest level is only about 0.5% of the overall clock signal path length.

In this embodiment of the present invention, the lengths of busses in the synthesized clock tree are generally related to the upper levels in the tree as follows: (i) the uppermost level (i.e., containing the clock tree origin at its midpoint) has a first length greater than the length of any other clock tree level, (ii) the level immediately below the uppermost level has a second length of from about half of the first length to about the first length, preferably from about three-fifths to about nine-tenths of the first length, and (iii) the level two levels below the uppermost level has a third length of from about half of the second length to about the second length, preferably from about three-fifths to about nine-tenths of the second length, but at least one of the second and third lengths is from about half of the first length to about three-quarters of the first length. In the lower clock tree levels, (iv) the next-to-lowest level has a fourth length of from about half of the length of the level immediately above it to about the length of the level immediately above it, preferably from about three-fifths to about nine-tenths of the length of the level immediately above it, and (v) the lowest level has a fifth length of from about half of the fourth length to about nine-tenths of the fourth length, preferably from about two-thirds to about nine-tenths of the fourth length. Where there are less than 5 levels, the number of line length relationships equals the number of levels. When there are more than 5 levels, the line length relationships between successive lower levels (both 1 and 2 levels removed) are as described in this paragraph.

The length of the lowest level may depend on the number of allowed locations placed on each branch. For example, if only one allowed location is placed at each terminal of the lowest clock tree level, then the length of the lowest clock tree level should be the sum of (i) about half of the length of the next-to-lowest level and (ii) about the width of an allowed location. On the other hand, if two allowed locations placed along each branch of the lowest clock tree level (e.g., one at the terminal and one at the midpoint), then the length of the lowest clock tree level should be the sum of (i) about two-thirds of the length of the next-to-lowest level and (ii) about half the width of an allowed location.

Similar to FIG. 5B, FIG. 6B shows array portion 400 with various numbers of clocked components placed in various component placement sublocations within allowed locations 412*aa*–412*bh*.

Figure 7:
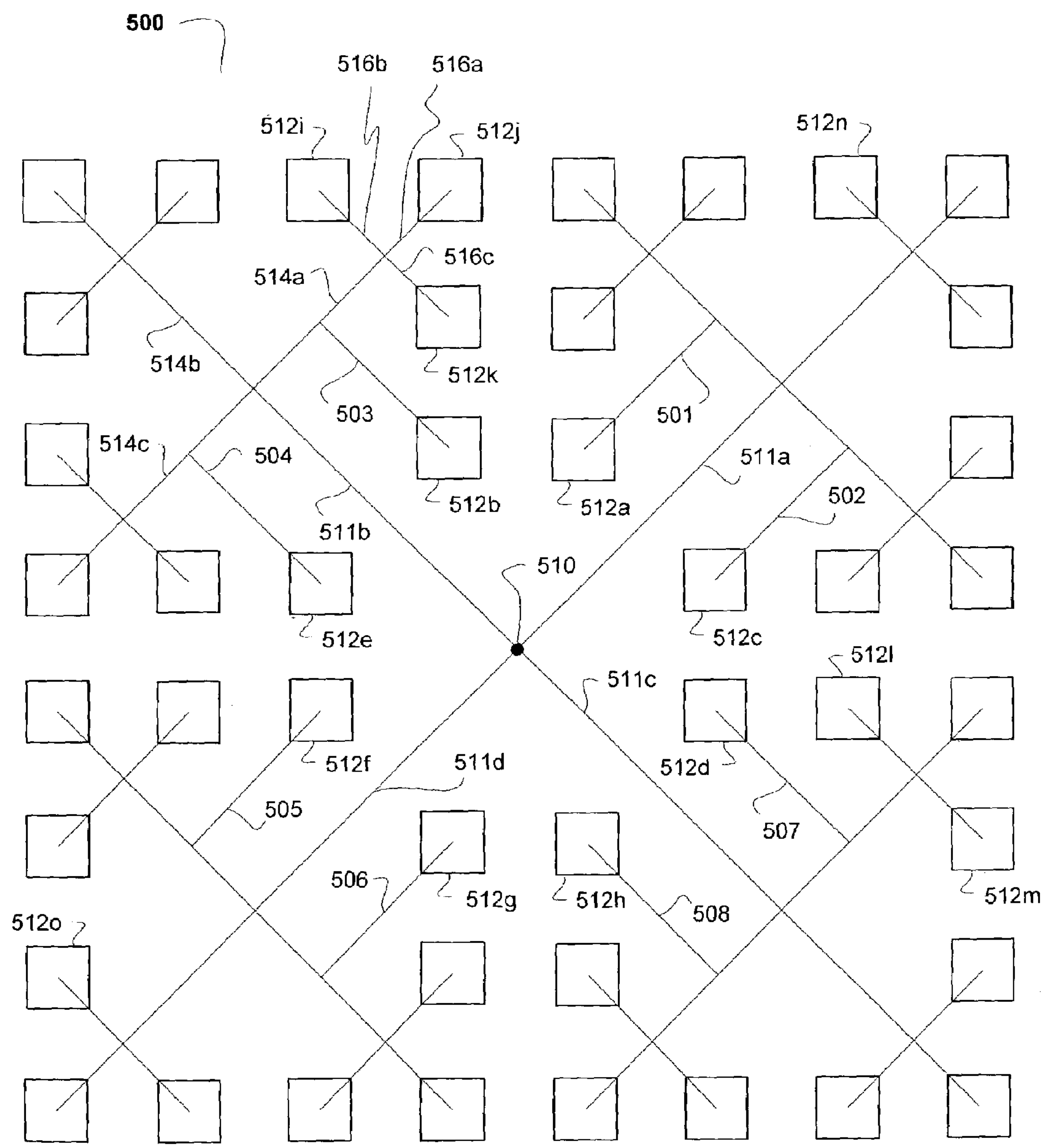
FIG. 7 is a diagram showing a further alternative embodiment of the present invention.
Figure 8:
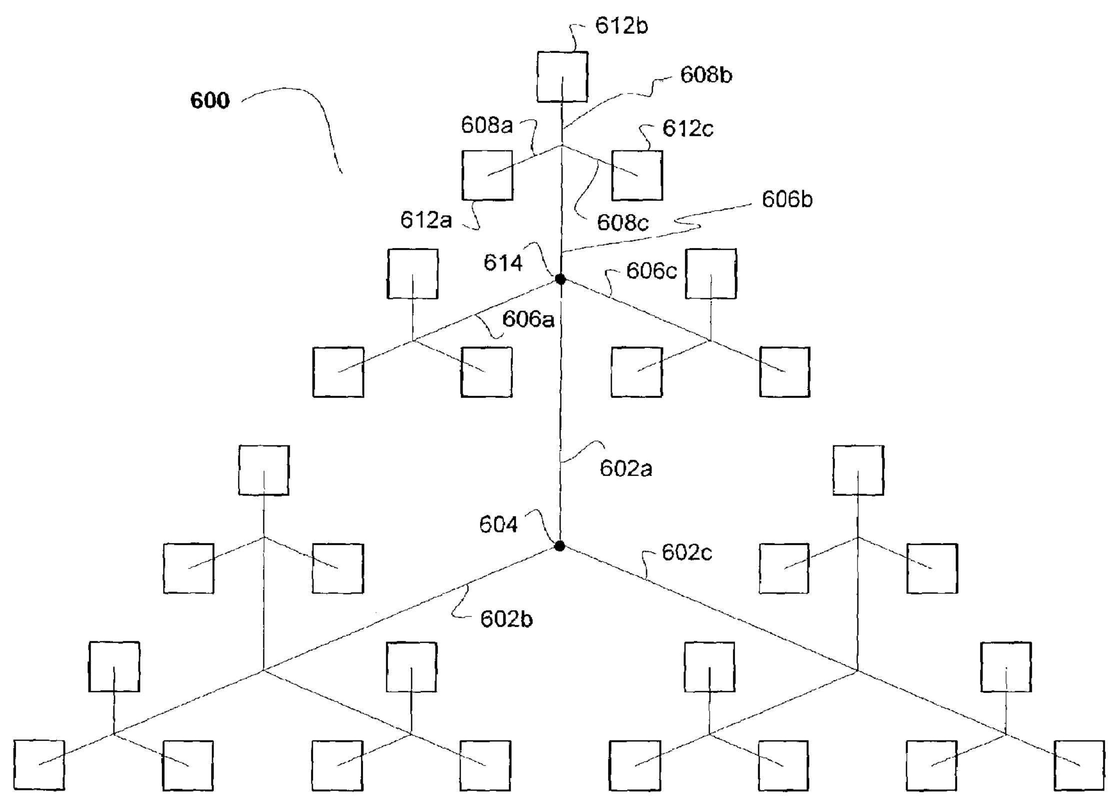
FIG. 8 is a diagram showing a further alternative embodiment of the present invention.

In addition, the clock tree routing pattern is not limited to an H tree. For example, FIG. 7 shows an "X tree" 500, and FIG. 8 shows a "triangle tree" 550. Referring now to FIG. 7, X tree 500 has 4 branches 511*a*–511*d* emanating from origin 510. Each of the branches 511*a*–511*d* has 3 branches (e.g., 514*a*–514*c*) at the end thereof. Each of those 3 branches has 3 more subbranches (e.g., 516*a*–516*c*) at the end thereof, ultimately terminating in an allowed location (e.g., 512*i*–512*k*). Optionally, additional branches 501–508 may be routed and additional allowed locations 512*a*–512*h* may be placed in accordance with the inventive concepts described herein. For example, additional branches 501–508 are each part of a clock signal path having about the same length from origin to destination as other clock signal paths in the tree. However, where such optional branches and allowed locations are absent, that space in the layout can be allocated for functional circuitry, such as clock generation, replication, recovery and/or propagation circuitry.

Furthermore, the spacing of allowed locations along each row and column axis follows the "nearest neighbor" distances described above. Perhaps surprisingly, the spacing of allowed locations along axes at a 45° angle to the row and column axes (e.g., the left-to-right, downward diagonal axis defined by allowed locations 512*i*, 512*k*, 512*a*, 512*c*, 512*l* and 512*m*, and/or the right-to-left, upward diagonal axis defined by allowed locations 512*n*, 512*a*, 512*f* and 512*o*) also follows the "nearest neighbor" distances described above. Consequently, axes defined by linearly aligned allowed locations are not limited to "row" and "column" axes.

Referring now to FIG. 8, triangle tree 600 has 3 branches 602*a*–602*c* emanating from origin 604. Each of the branches 602*a*–602*c* has 3 branches (e.g., 606*a*–606*c*) at the terminal away from the origin 604. Each of those 3 branches 606*a*–606*c* has 3 subbranches (e.g., 608*a*–608*c*) at the terminal opposite the branch 602*a*, ultimately terminating in an allowed location (e.g., 612*a*–612*c*). The spacing of allowed locations along each row and column axis generally follows the "nearest neighbor" distances described above, as does the spacing of allowed locations along axes at a 60° angle to the row and column axes. However, approximately equal "nearest neighbor" distances may not apply to all allowed locations along all parallel axes in the axis array, but rather, to a subset and/or plurality of such parallel axes. In other words, the distance between each of the allowed locations and a first nearest neighbor along a plurality of parallel first axes may be a first value along a first subset of the parallel first axes, but a second, different value along a second subset of the parallel first axes. Similarly, each of the allowed locations along a plurality of parallel second axes may be a first distance from a second nearest neighbor along a first subset of the parallel second axes, and a second, different distance from a second nearest neighbor along a second subset of the parallel second axes. For allowed locations having first and second nearest neighbors along one or two axes, each of the allowed locations having a second nearest neighbor along a plurality of parallel first axes may be a third distance from the second nearest neighbor along a first subset of the parallel first axes, but a fourth, different distance from the second nearest neighbor along a second subset of the parallel first axes. Furthermore, each of the allowed locations having a second nearest neighbor along a plurality of parallel second axes may be a fifth distance from the second nearest neighbor along a first subset of the parallel first axes, but a sixth, different distance from the second nearest neighbor along a second subset of the parallel second axes. Space in the center of the "triangle tree" may be allocated for one or more other functions, such as clock generation, replication, recovery and/or propagation, if desired.

Optionally, additional branches may be routed from a branch point to an opposite end point equidistant from one shown in FIG. 8, and additional allowed locations may be placed at appropriate destinations (or along the lowest level branches) in accordance with the inventive concepts described herein. For example, if branch 602*a* has a length of about 4 units from origin to branch 606*b*, branch 606*b* has a length of about 2 units from branch 602*a* to branch 608*b*, and branch 608*b* has a length of about 1 unit, additional clock signal paths having a length of about 7 units from origin to destination may be routed. A convenient space for routing such additional lines is opposite a branch at its branch point (e.g., a 7-unit-length branch opposite branch 602*a*, starting from origin 604; a 3-unit-length branch opposite branch 606*a*, starting from branch point 614; etc.).

Combinations of different tree types are also contemplated by the invention. For example, a 1-level "X" tree can be routed to distribute a clock to 4 circuit blocks or tiles in a 2-by-2 array, or a 2-level "X" tree can be routed to distribute a clock to 12 circuit blocks or tiles on the perimeter of a 4-by-4 array, and H trees may be routed within each block or tile to distribute the clock signal to leaf cells or destinations. Alternatively, a 1-level "triangle tree" can be routed to distribute a clock to 3 circuit blocks or tiles, and H or X trees may be routed within each block or tile to distribute the clock signal to leaf cells or destinations.

In the case of X or triangle trees, the routed lines may comprise a plurality of alternating vertical and horizontal lines (in accordance with conventional lithographic and manufacturing processes and/or techniques), e.g. in a "zig-zag" pattern. The number and lengths of such alternating vertical and horizontal lines may be any that adequately route the clock tree while maintaining consistency with the clock tree synthesis concepts described above. Preferably, however such alternating vertical and horizontal lines are as short as possible and/or feasible within the set of design rules and/or routing algorithms being used.

By synthesizing and routing the clock tree such that all clock signal paths have about the same length, clock skew in a circuit block having $10^5$–$10^6$ gates, manufactured in a 0.15–0.18 micron fabrication technology, can be reduced to 5–10 ps.

An Exemplary Method of Reducing Power in an Integrated Circuit

In a further aspect, the present invention relates to a method of reducing power in an integrated circuit, comprising the steps of (a) placing components in an array of allowed locations in a floor plan corresponding to the integrated circuit, wherein each of the components receives a clock signal and each of the allowed locations is about the same distance from a first nearest neighbor along at least a first axis as are other allowed locations along the first axis, (b) routing the clock signal to the components along a clock tree comprising a plurality of clock paths from an origin of the clock tree to one of the allowed locations, each of the clock paths having a length within a range of from $x-y$ to $x+y$, where x is a predetermined length and y is the distance from the allowed location to the first nearest neighbor, and (c) independently routing a plurality of combinational paths from at least first and second of the components to at least third and fourth of the components. In a preferred embodiment, these steps are performed sequentially.

As described above, the present method of placing and routing provides power saving benefits when each of the allowed locations in the array is regularly spaced from its nearest neighbors. Furthermore, meeting timing requirements is better ensured when clocked components are regularly spaced and each of the routed combinational paths does not exceed a predetermined maximum length.

Figure 9:
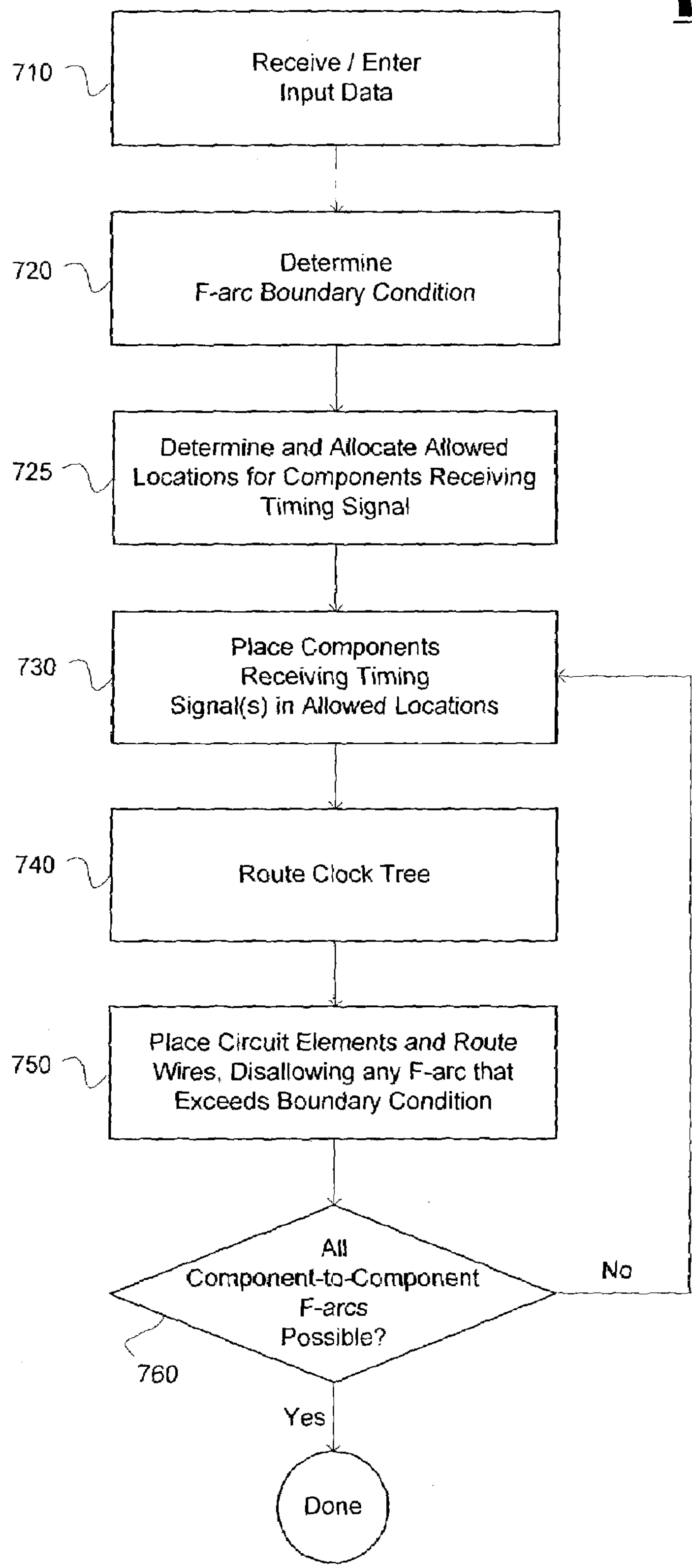
FIG. 9 is flow chart outlining the steps taken in one embodiment of the present method and/or algorithm.

A flow chart 700 outlining an exemplary embodiment of the power- and/or current-saving method and/or algorithm is shown in FIG. 9. In the general method and/or algorithm, input data relating to characteristic properties of the fabrication technology and or timing signals for the circuit being designed may be input into the place-and-route or design software (see step 710 of FIG. 9). In some embodiments, such input data may be automatically generated and/or received by the design software by selection or designation of the fabrication process and/or operating frequency of an internal or external (master) clock signal. An F-arc boundary condition may then be determined (see step 720 of FIG. 9), either by calculating it from the input data or by empirical determination and/or selection by the designer. In preferred embodiments, the F-arc boundary condition is a maximum length or maximum propagation time, more preferably a maximum length.

Once a clocked component timing boundary is set, allowed locations are determined and/or allocated for components of the circuit receiving a clock or timing signal, and then the allowed locations are placed in a floor plan corresponding to the physical circuit being designed (see step 725 in FIG. 9). In one embodiment, the method and/or algorithm determines such allowed locations such that any components placed therein cannot exceed or violate the F-arc boundary condition. In a preferred embodiment, the floor plan comprises a plurality or array of blocks or tiles, and the method and/or algorithm first identifies and allocates an array of regularly or evenly spaced allowed locations for clocked circuit components in one or more blocks or tiles (preferably a plurality of blocks or tiles, and more preferably, all blocks or tiles having arrays of clocked components), then places clocked circuit components in the allowed locations (see step 730 of FIG. 9).

Once components have been placed, a clock tree is synthesized and routed as described above (see step 740 of FIG. 9). Thereafter, combinational circuit elements are placed in remaining available locations, then wires are routed between the clocked components and combinational elements in the remaining space to form combinational signal paths between the clocked components (see step 750 of FIG. 9). If all of the combinational signal paths needed in the design are formed without exceeding the boundary condition, placing and routing is complete; if not, then the software returns to step 725, and adjusts the placement of the allowed locations. The software may arbitrarily move the allowed locations closer together or farther apart along one or two axes, then determine again whether all combinational paths have been placed and routed. Where the process is expected to be iterative, the software may calculate an allowed F-arc placement rate, an unformed combinational path number, or the like, and make future allowed location placement and/or adjustment decisions on trends in such calculations. For example, when an allowed F-arc placement rate increases over two or more iterations of method 700, the software may assume that the allowed location adjustment made between iterations is in an appropriate direction, and may make future allowed location adjustments in the same direction (i.e., increase or decrease one or more distances between one or more nearest neighbors along one or more axes).

Although specific steps are disclosed in regard to the operation of the exemplary method and/or algorithm of FIG. 9, such steps are exemplary. That is, the present invention is well suited to use with various other steps or variations of the steps described above. Additionally, for purposes of clarity and brevity, the discussion herein is directed at times to specific examples. The present invention, however, is not limited solely to use with a particular architecture, method, process, software tool or device. Instead, the present invention is well suited to use with other architectures, software, circuitry, methods and processes in which it may be desirable to accomplish a multitude of tasks as part of an overall process directed at (1) ensuring timing in an integrated circuit at a clocked circuit component level and (2) reducing power in an integrated circuit by distinguishing clocked components from combinational elements, and optimizing placement and routing for clocked components and the corresponding clock signal(s).

Further examples of suitable systems, tools and/or methods in which the present invention is generally applicable include those described in, e.g., U.S. Pat. Nos. 6,080,201, 6,212,489, 5,798,936 and 5,550,748, the relevant portions of which are each incorporated herein by reference, and those commercially available from place-and-route software vendors such as Cadence Design Systems (e.g., the SILICON ENSEMBLE™, SILICON ENSEMBLE-PKS™, FIRST ENCOUNTER™, and NANO ENCOUNTER™ tools), Silicon Valley Research, Inc. (e.g., the QIC/APR™, GARDS™, SC™ and FLOORPLACER™ tools), Synopsis (e.g., the CHIP ARCHITECT™, DESIGN COMPILER™, and FLOORPLAN COMPILER™ tools) and Mentor Graphics (e.g., the AUTOCELLS™ tool).

Exemplary Software Implementing the Invention

In another aspect, the present invention relates to software for implementing the above method(s). Thus, in another embodiment, the invention concerns a medium or waveform containing a computer-readable set of instructions which, when executed, implement one or more of the above exemplary methods. In more specific implementations, the instructions further comprise (i) determining areas of the floor plan for the allowed locations; (ii) partitioning the floor plan into a plurality of tiles; (iii) calculating a boundary condition such that no combinational path can exceed the boundary condition; (iv) routing the clock signal to the components; (v) placing combinational elements in the floor plan; and/or (vi) independently routing the wires between the combinational elements and/or between the components and the combinational elements; among other instructions disclosed herein. In preferred implementations, the boundary condition comprises a maximum propagation time or a maximum length; the combinational paths each comprise n wires and (n−1) combinational elements, where n is an integer of at least 2, preferably at least 3 and more preferably at least 5.

Exemplary Circuit and Chip Layouts, Architectures and/or Designs

First Exemplary Embodiment

Yet another aspect of the present invention concerns circuit and chip layouts, architectures and/or designs. In a further embodiment, the invention relates to a layout for an integrated circuit, comprising (a) a plurality of components in an array of allowed locations in the layout, wherein each of the components receives a clock signal and each of the allowed locations is about the same distance from a first nearest neighbor along at least a first axis as are other allowed locations along the first axis; and (b) a plurality of combinational paths from at least first and second of the components to at least third and fourth of the components.

As described above for the exemplary methods, in the present layout and/or architecture, each of the allowed locations may have: (i) a second nearest neighbor along the first axis that is about the same distance away as is at least one other such allowed location along the first axis; and/or (ii) a second nearest neighbor along a second axis that is about the same distance away as other allowed locations along the second axis are from at least one of their nearest neighbors. Furthermore, in an array, each of the allowed locations along (1) a plurality of parallel first axes is about the same distance from a first nearest neighbor as are other allowed locations along any of the parallel first axes, and/or (2) a plurality of parallel second axes is about the same distance from a second nearest neighbor along a common second axis as are other allowed locations along any of the second axes from their second nearest neighbor.

In the present layout, each of the combinational paths may comprise n wires and (n−1) combinational elements, where n is an integer of at least 2 (preferably at least 3 and more preferably at least 5), and each of the wires electrically connect (i) at least two of the combinational elements and/or (ii) at least one of the components and at least one of the combinational elements. In such embodiments, at least 1 (preferably at least 2 and more preferably at least 3) of the combinational elements in each combinational path comprises a buffer.

The present layout and/or architecture may further comprise the clock tree or bus, electrically coupled to the components. In preferred embodiments, the components are selected from the group consisting of flip-flops, latches and registers. As described above, in certain preferred embodiments, no combinational path in the layout exceeds a boundary condition. In preferred implementations, the boundary condition comprises a maximum propagation time or a maximum length.

In general, a "circuit block" is a block of circuitry that physically occupies an area on a chip defined by a single border (although the border may be arbitrary in shape and/or dimensions), and a "clock domain" is circuitry that receives a common clock signal or its logical equivalent, in order to have certain events within the circuitry occur at expected and/or predetermined times. Preferably, the present invention relates to a chip having at least 2 clock domains, and each clock domain comprises one or more circuit blocks.

Naturally, the invention is not limited to a design having a particular number or configuration of circuit blocks and/or wires. However, in preferred embodiments, the chip design has at least 2 such blocks, more preferably at least 4 such blocks, that are coupled at least to physically adjacent blocks by either (i) a plurality of single-bit wires, or (ii) at least one multi-bit bus. Coupled circuit block may operate according to a common clock signal, in which case at least one of the wires between blocks so operating electrically communicates the clock signal from one block to the other block. In addition, multiple circuit blocks may each operate in a common clock domain, in which case one of the blocks may provide a clock generation, clock replication and/or clock recovery function, and at least one of the wires from a block providing such clock function(s) to the other block(s) electrically communicates the generated, replicated and/or recovered clock signal.

In an alternative embodiment, the invention relates to a layout and/or architecture for an integrated circuit, comprising (a) a plurality of components in an array of allowed locations in the layout, wherein each of the components receives a clock signal and each of the allowed locations is about the same distance from a first nearest neighbor along at least a first axis as are other allowed locations along the first axis; and (b) a clock tree electrically coupled to the components and providing the clock signal, the clock tree comprising a plurality of clock paths from an origin of the clock tree to one of the allowed locations, and each of the clock paths having a length within a range of from a predetermined length to the predetermined length minus about the distance from the allowed location to the first nearest neighbor. The other "nearest neighbor" relationships for allowed locations described above may also apply to this alternative layout or architecture. In addition, the layout generally further comprises a plurality of combinational paths from at least two components to at least two other components. In a preferred embodiment, the combinational paths each comprise n wires and (n−1) combinational elements, where n is an integer of at least 2, and each of the wires electrically connect (i) at least two of the combinational elements and/or (ii) at least one of the components and at least one of the combinational elements.

In the alternative layout, the clock tree preferably comprises an H tree, and the combinational elements generally do not receive the clock signal. Other preferred embodiments and implementations may be as described above for other aspects of the invention.

Exemplary Chip Embodiments

Figure 10:
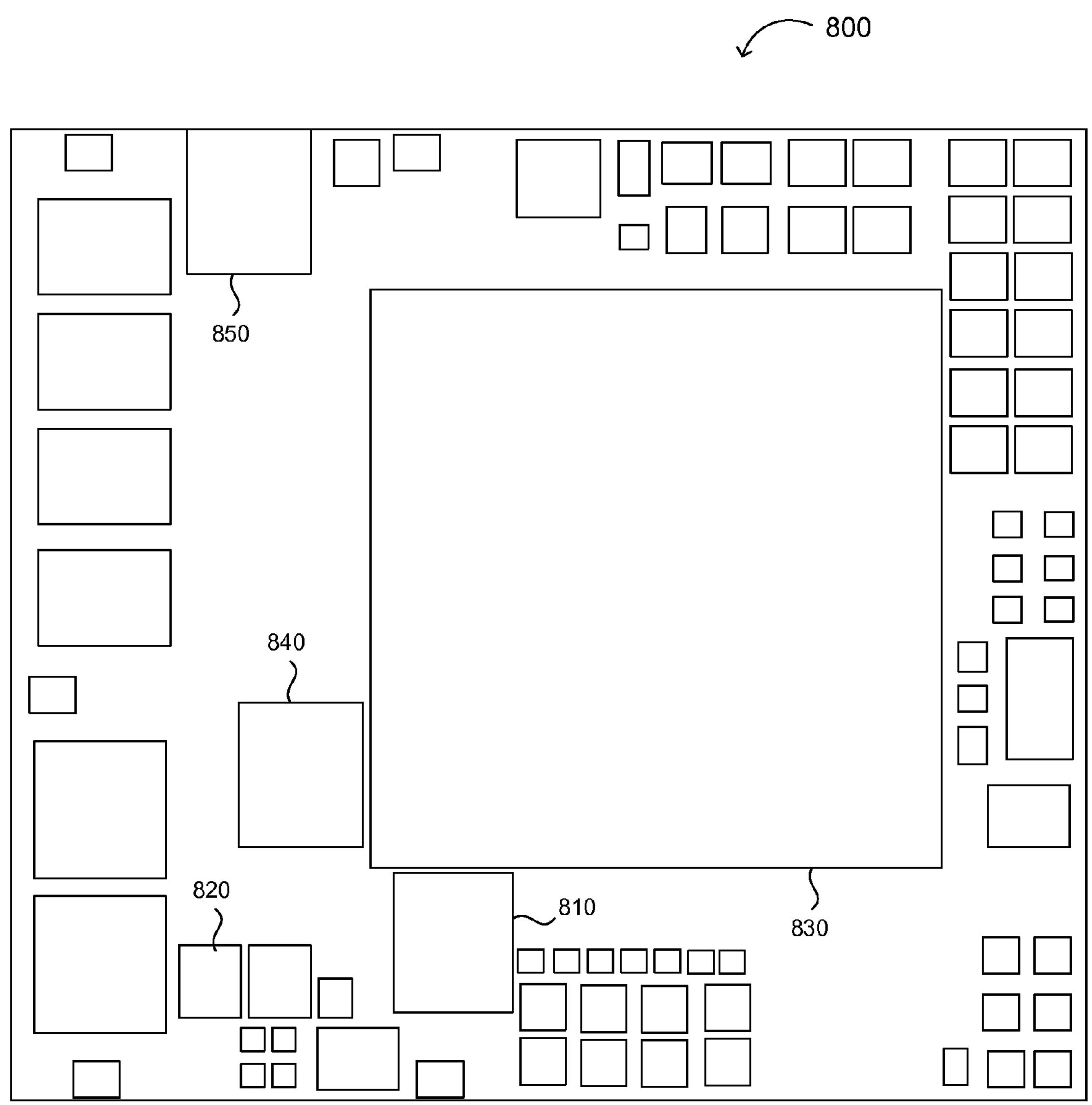
FIG. 10 is an exemplary chip layout, showing a number of functional areas, or circuit blocks, on the chip, some of which include a clock tree and clocked circuit components in accordance with the present invention.

FIG. 10 shows an actual chip design 800, implementing the present invention. Circuit blocks 810, 820, 830, 840 and 850 include clock tree circuitry and clocked components placed and routed therein according to the present invention. While each of the circuit blocks 810, 820, 830, 840 and 850 are a different clock domain, each has an H tree clock architecture therein.

Figure 11:
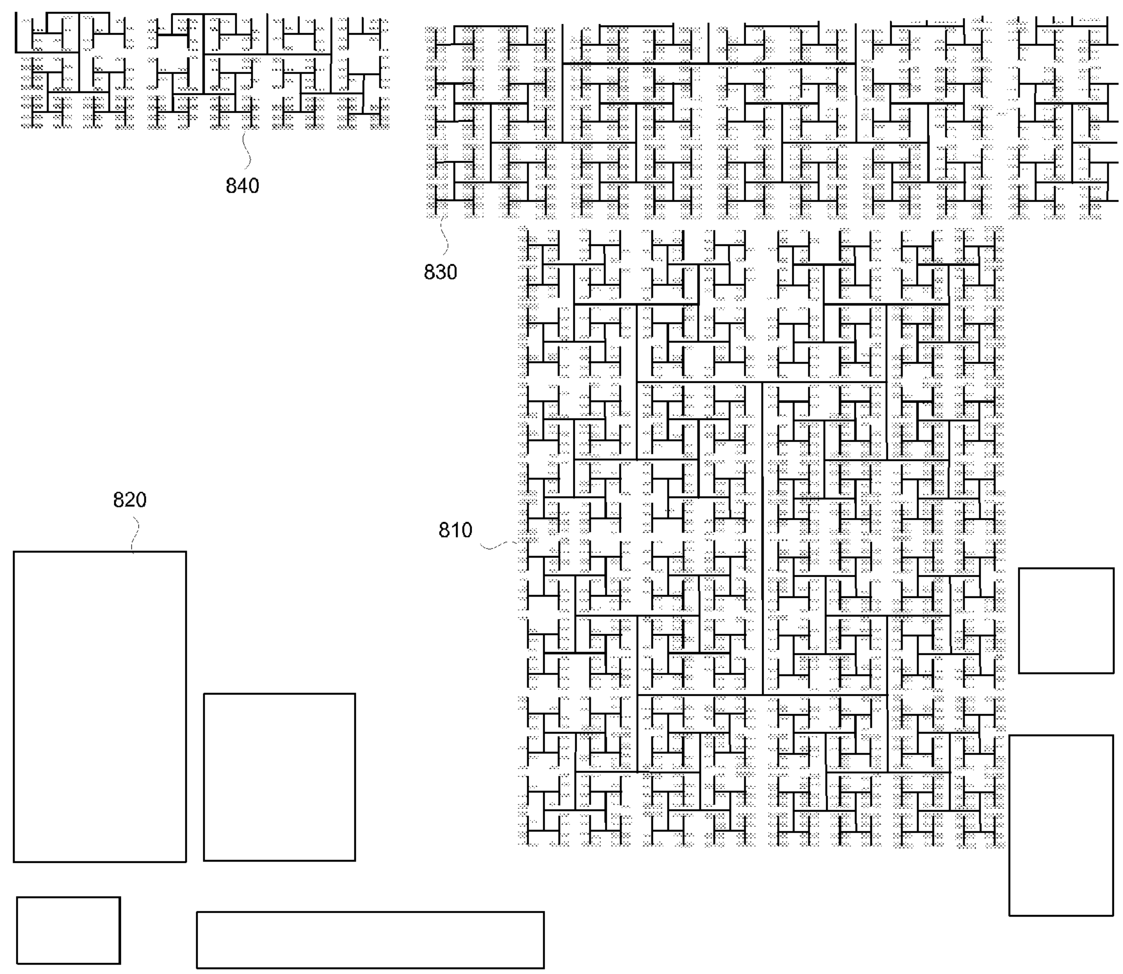
FIG. 11 shows a part of the layout of FIG. 10 in greater detail.

FIG. 11 shows a portion of chip design 800 in greater detail, including the entirety of circuit block 810. Circuit block 810 includes a 9-level clock tree, in which the top level has the greatest length, the second level has a length about three-quarters of the top level length, the third level has a length about two-thirds of the second level length, the fourth level has a length about three-quarters of the third level length, the fifth level has a length about three-fifths of the fourth level length, the sixth level has a length about four-fifths of the fifth level length, the seventh level has a length about two-thirds of the sixth level length, the eighth level has a length about three-quarters of the seventh level length, and the lowest level has a length about six-sevenths of the eighth level length. Allowed locations, each consisting essentially of a 2-by-2 array of component placement sublocations, have been placed at the terminals and the midpoints of each branch of the lowest clock tree level. The density of flip-flops placed in the allowed locations is highest along the right-hand and bottom perimeters and along the upper right-hand perimeter, with relatively high densities near the top and bottom of the lower right-hand quadrant and throughout the lower right portion of the upper right-hand quadrant. Similar patterns appear along the lower perimeter of block 840 and in the lower left-hand corner of block 830. In block 820, all allowed component placement sublocations are occupied by flip-flops.

Figure 12:
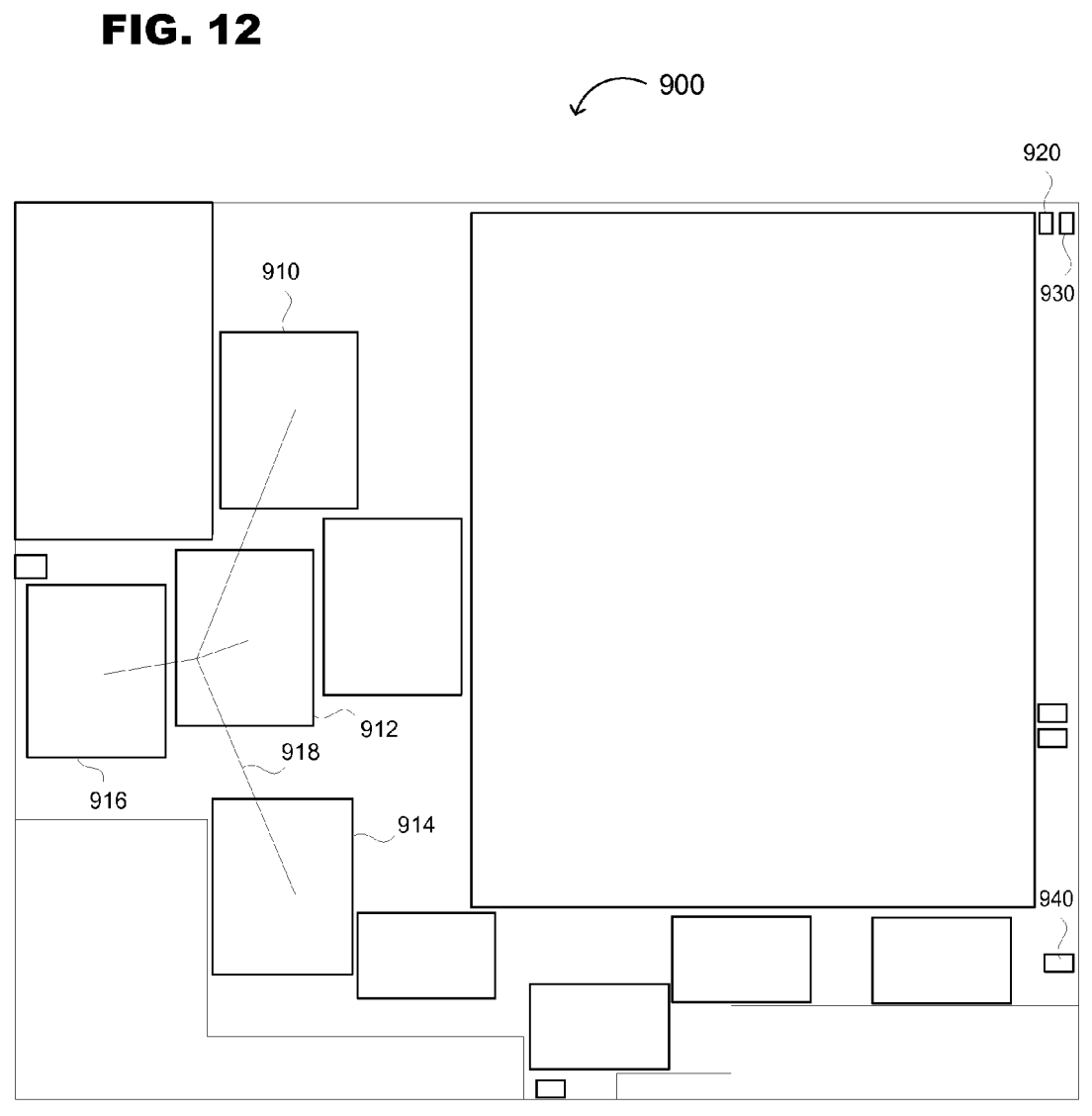

FIG. 12 shows a second actual chip design 900, implementing the present invention. The design of FIG. 12 includes 17 circuit blocks with clock tree circuitry and clocked components placed and routed therein according to the present invention (implementing the H tree clock architecture). Circuit blocks 910, 912, 914 and 916 are all in a common clock domain, and a "star" clock bus 918 distributes a common clock signal to the blocks. While the lengths of the individual branches of the "star" clock bus 918 differ, the design can be modified to take whatever skew that is introduced by these differing lengths into account (e.g., by delaying the outputs of block 912 by an amount of time corresponding to the time delay introduced by the branch providing the clock signal to block 916), or to minimize the skew itself (e.g., by modifying the physical parameters of the branches). The beneficial effects of the invention are realized in clock trees as small as 3 or 4 levels such as may be contained in circuit blocks 920, 930, and 940.

Comparative Example

The power savings realized by the present invention in an actual chip design have been demonstrated. An example, with clock trees and clocked components placed and routed in accordance with the present invention, includes about $10^7$ gates and 3 sets of circuit blocks. A first set of circuit blocks operates in a first clock domain, and a second set of circuit blocks operates in a second clock domain. The remaining third set of circuit blocks does not use clock trees and clocked components according to the invention.

Exemplary clock trees for the functional hardware description described above have been placed and routed with a place-and-route tool and methodology according to the present invention and also with a conventional place-and-route tool that has been optimized for input/output signal path lengths. The place-and-route tool and methodology according to the present invention provided the same chip-level functionality and timing as that of the conventional method, but used about 50 times fewer clock buffers to distribute the clock signal. This resulted in about a 30% reduction in peak power consumption.

Exemplary Methods of Manufacturing an Integrated Circuit

First Exemplary Embodiment

Yet another aspect of the present invention concerns a method of manufacturing an integrated circuit, comprising the steps of (a) forming transistors for (i) circuit components receiving a clock signal only in allowed locations in at least a portion of the integrated circuit, each of the allowed locations being about the same distance from a first nearest neighbor along at least a first axis as are other allowed locations along the first axis, and (ii) combinational elements not receiving the clock signal in other locations; and (b) forming wires between the components and the combinational elements to form a plurality of combinational paths between at least first and second components and third and fourth components, each combinational path comprising n wires and (n−1) combinational elements, wherein n is an integer of at least 2. As for other aspects of the invention, other "nearest neighbor" relationships may also apply to this aspect of the invention (e.g., where the clocked components are formed in locations having a second nearest neighbor along a second axis that are about the same distance from the second nearest neighbor as are other locations along the second axis from one of their nearest neighbors).

When actually fabricated, the wires may be located on the same or different layers of metallization in the chip, and each "wire" depicted in a combinational signal path or clock tree may individually comprise one or more wire segments, electrically coupled to each other and/or to circuit elements by contacts or vias. Each of the wire segments and the contacts or vias contributes to the length and/or propagation/delay time of the signal path.

In preferred embodiments, each of the first, second third and fourth components are selected from the group consisting of flip-flops, latches and registers; each of a plurality of the combinational elements may comprise a buffer; and/or no combinational path in the layout may exceed a boundary condition (and the boundary condition may comprise a maximum propagation time or a maximum length).

In further embodiments, the method further comprises (i) forming transistors for a plurality of combinational elements in locations other than allowed locations and locations in which a clock tree has been routed and/or a clock buffer has been placed; (ii) making wires to form combinational paths, each combinational path comprising n wires and (n−1) combinational elements, where n is an integer of at least 2, and each of the wires electrically connect at least two of the combinational elements and/or at least one of the components and at least one of the combinational elements.

Second Exemplary Embodiment

In an alternative embodiment, the invention relates to a method of manufacturing an integrated circuit, comprising the steps of (a) forming transistors for (i) circuit components receiving a clock signal only in allowed locations in at least a portion of the integrated circuit, each of the allowed locations being about the same distance from a first nearest neighbor along at least a first axis as are other allowed locations along the first axis, and (ii) a clock circuit in other locations, the clock circuit providing the clock signal; and (b) forming wires between the transistors of the clock circuit and the components to form a clock tree comprising a plurality of clock paths having a skew of not more than a period of the clock signal. In this alternative method, the same "nearest neighbor" relationships may apply as for the other aspects of the invention, and many preferred embodiments are as described for the first embodiment for manufacturing an integrated circuit.

In some preferred implementations, each of the clocked components is selected from the group consisting of flip-flops, latches and registers. This implementation may also apply to other embodiments and aspects of the invention.

An Exemplary System for Performing the Present Method

Figure 13:
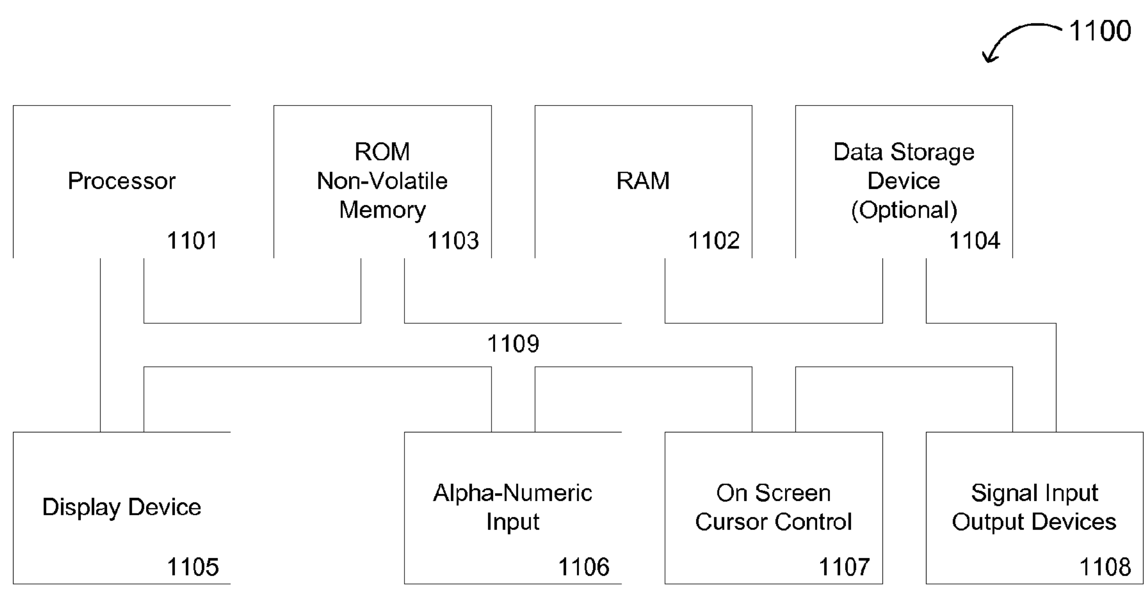
FIG. 13 shows an exemplary computer system, in which the present invention may be implemented.

Referring now to FIG. 13, in a further aspect of the invention, the system comprises at least one computer system 1100, which may form a platform for practicing embodiments of the invention. Computer system 1100 includes an address/data bus 1109 for communicating information, a central processor 1101 coupled with the bus for processing information and instructions, a volatile memory 1102 (e.g., random access memory or RAM) coupled with the bus 1109 for storing information and instructions for the central processor 1101, and a non-volatile memory 1103 (e.g., read only memory or ROM) coupled with the bus 1109 for storing static information and instructions for the processor 1101. Computer system 1100 also includes a data storage device 1104 (e.g., a magnetic or optical disk and disk drive) coupled with the bus 1109 for storing information and instructions. With reference still to FIG. 9, system 1100 of the present invention also includes an optional alphanumeric input device 1106 including alphanumeric and function keys (e.g., a conventional keyboard). Alphanumeric input device 1106 may be coupled to bus 1109 for communicating information and command selections to central processor unit 1101. System 1100 also optionally includes a cursor control device 1107 (e.g., a conventional mouse) coupled to bus 1109 for communicating user input information and command selections to central processor unit 1101. System 1100 also includes an optional display device 1105 (e.g., a conventional monitor) coupled to bus 1109 for displaying information. One or more signal input/output communication devices 1108 coupled to bus 1109 may provide communication with external devices.

The present invention has particular advantage in integrated circuits having moderate to high logic complexity, such as microprocessors, digital signal processors, field programmable gate arrays (FPGAs), complex programmable logic devices (CPLDs), and speech recognition chips.

CONCLUSION/SUMMARY

Thus, the present invention provides a convenient, simple and efficient architecture, method and system for. The present method, system and architecture greatly, enabling one to, and improve.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of placing and routing, comprising the steps of:

a) placing components in an array of allowed locations in a floor plan corresponding to a circuit, wherein each of said components receives a clock signal and each of said allowed locations is about the same distance from a first nearest neighbor along a first axis as are other allowed locations along said first axis; and b) independently routing a plurality of combinational paths from at least first and second of said components to at least third and fourth of said components.

2. The method of claim 1, wherein each of said allowed locations having a second nearest neighbor along said first axis is about the same distance from said second nearest neighbor along said first axis as is at least one other such allowed location.

3. The method of claim 1, wherein each of said allowed locations is about the same distance from a second nearest neighbor along a second axis as are other allowed locations along said second axis.

4. The method of claim 1, wherein each of said allowed locations along a plurality of parallel first axes is about the same distance from said first nearest neighbor as are other allowed locations along any of said plurality of parallel first axes.

5. The method of claim 4, wherein each of said allowed locations along a plurality of parallel second axes is about the same distance from a second nearest neighbor along a common second axis as is at least one other allowed location along each of said plurality of second axes.

6. The method of claim 1, wherein said combinational paths each comprise n wires and (n−1) combinational elements, and n is an integer of at least 2; and said method further comprises placing said combinational elements in said floor plan, and said routing comprises independently routing said wires between said combinational elements and/or between said components and said combinational elements.

7. The method of claim 6, wherein said combinational elements do not receive said clock signal.

8. The method of claim 6, wherein n is an integer of at least 5.

9. The method of claim 8, wherein at least three of said combinational elements comprise a buffer.

10. The method of claim 6, wherein at least one of said combinational elements comprises a buffer.

11. The method of claim 1, further comprising the step of placing said components in said allowed locations.

12. The method of claim 1, further comprising the step of routing said clock signal to said components.

13. The method of claim 1, wherein said components are selected from the group consisting of flip-flops, latches and registers.

14. The method of claim 1, wherein said routing comprises placing and routing each of said combinational paths such that no signal path in said circuit exceeds a boundary condition.

15. The method of claim 14, wherein said boundary condition comprises a maximum propagation time or a maximum length.

16. A medium or waveform containing a computer-readable set of instructions, said instructions comprising the method of claim 1.

17. The medium or waveform of claim 16, wherein said instructions further comprise determining areas of said floor plan for said allowed locations.

18. The medium or waveform of claim 17, further comprising the step of partitioning said floor plan into a plurality of tiles.

19. The medium or waveform of claim 18, further comprising the step of routing said clock signal to said components.

20. The medium or waveform of claim 16, wherein said instructions further comprise calculating a boundary condition such that no combinational path can exceed said boundary condition.

21. The medium or waveform of claim 20, wherein said boundary condition comprises a maximum propagation time or a maximum length.

22. The medium or waveform of claim 16, wherein said combinational paths each comprise n wires and (n−1) combinational elements, and n is an integer of at least 2; and said instructions further comprise placing said combinational elements in said floor plan, and said routing comprises independently routing said wires between said combinational elements and/or between said components and said combinational elements.

23. A computer system further comprising the medium or waveform of claim 16, configured to execute said computer-readable set of instructions.

24. A method of routing a timing signal, comprising the steps of:

a) placing components in an array of allowed locations in a floor plan corresponding to a circuit, wherein each of said components receives a clock signal and each of said allowed locations is about the same distance from a first nearest neighbor along at least a first axis as are other allowed locations along said first axis; and b) routing said clock signal to independently routing a plurality of combinational paths from at least first and second of said components to at least third and fourth of said components.

25. The method of claim 24, wherein each of said allowed locations having a second nearest neighbor along said first axis is about the same distance from said second nearest neighbor along said first axis as is at least one other such allowed location.

26. The method of claim 24, wherein each of said allowed locations along a plurality of parallel first axes is about the same distance from said first nearest neighbor as are other allowed locations along any of said parallel first axes.

27. The method of claim 24, wherein each of said allowed locations is about the same distance from a second nearest neighbor along a second axis as is at least one other such allowed location along said second axis.

28. The method of claim 27, wherein each of said allowed locations is about the same distance from a second nearest neighbor along a second axis as are all other such allowed locations along said second axis.

29. The method of claim 27, wherein each of said allowed locations along a plurality of parallel second axes is about the same distance from a second nearest neighbor along a common second axis as is at least one other allowed locations along each of said plurality of parallel second axes.

30. The method of claim 24, wherein said combinational paths each comprise n wires and (n−1) combinational elements, and n is an integer of at least 2; and said method further comprises placing said combinational elements in said floor plan, and said routing comprises independently routing said wires between said combinational elements and/or between said components and said combinational elements.

31. The method of claim 30, wherein said combinational elements do not receive said clock signal.

32. The method of claim 30, wherein a plurality of said combinational elements comprises a buffer.

33. The method of claim 24, wherein said components are selected from the group consisting of flip-flops, latches and registers.

34. The method of claim 24, wherein said routing comprises placing and routing each of said combinational paths such that no signal path in said circuit exceeds a boundary condition.

35. The method of claim 34, wherein said boundary condition comprises a maximum propagation time or a maximum length.

36. A medium or waveform containing a computer-readable set of instructions, said instructions comprising the method of claim 24.

37. The medium or waveform of claim 36, wherein said instructions further comprise determining areas of said floor plan for said allowed locations.

38. The medium or waveform of claim 37, further comprising the step of partitioning said floor plan into a plurality of tiles.

39. A computer system further comprising the medium or waveform of claim 36, configured to execute said computer-readable set of instructions.

40. The medium or waveform of claim 24, wherein said combinational paths each comprise n wires and (n−1) combinational elements, and n is an integer of at least 2; and said instructions further comprise placing said combinational elements in said floor plan, and said routing comprises independently routing said wires between said combinational elements and/or between said components and said combinational elements.

41. A method of reducing power in an integrated circuit, comprising the steps of:

a) placing components in an array of allowed locations in a floor plan corresponding to said integrated circuit, wherein each of said components receives a clock signal and each of said allowed locations is about the same distance from a first nearest neighbor along at least a first axis as are other allowed locations along said first axis;

b) routing the clock signal to the components along a clock tree comprising a plurality of clock paths from an origin of the clock tree to one of the allowed locations, each of the clock paths having a length within a range of from x−y to x+y, where x is a predetermined length and y is about the distance from the allowed location to the first nearest neighbor; and c) independently routing a plurality of combinational paths from at least first and second of the components to at least third and fourth of the components.

42. The method of claim 41, wherein each of said allowed locations in said array is regularly spaced from the nearest neighbors thereto.

43. The method of claim 41, wherein each of said combinational paths does not exceed a predetermined maximum length.

44. A medium or waveform containing a computer-readable set of instructions, said instructions comprising the method of claim 41.

45. A computer system further comprising the medium or waveform of claim 41, configured to execute said computer-readable set of instructions.

46. A method of placing and routing in an integrated circuit design, comprising the steps of:

a) placing components in an array of allowed locations in a floor plan corresponding to a circuit, wherein each of said components receives a clock signal and said allowed locations are regularly spaced along said first axis; and b) routing a plurality of combinational paths, each path comprising independently routing a plurality of combinational paths from at least first and second of said components to at least third and fourth of said components.

* * * * *

UNITED STATES PATENT AND TRADEMARK OFFICE

CERTIFICATE OF CORRECTION

PATENT NO. : 7,178,124 B1
APPLICATION NO. : 10/452811
DATED : February 13, 2007
INVENTOR(S) : Mikhail Makarov et al.

It is certified that error appears in the above-identified patent and that said Letters Patent is hereby corrected as shown below:

IN THE CLAIMS

Claim 24, col. 25, line 45: change "axis; and" to --axis;--.

Claim 24, col. 25, line 46: change "routing said clock signal to independently routing a plurality of combinational paths" to --independently routing a plurality of combinational paths--.

Claim 24, col. 25, line 49: change "components." to --components; and--.

Claim 24, col. 25, after line 49, add a new line --c) routing said clock signal to said components.--.

Claim 46, col. 28, line 6: change "said first axis" to --a first axis--.

Claim 46, col. 28, lines 8-12: change "routing a plurality of combinational paths, each path comprising independently routing a plurality of combinational paths from at least first and second of said components to at least third and fourth of said components." to --independently routing a plurality of combinational paths from at least first and second of said components to at least third and fourth of said components, each combinational path comprising a combination of at least two wires and at least one element between two of said components.--.

Signed and Sealed this
Nineteenth Day of July, 2011

David J. Kappos
*Director of the United States Patent and Trademark Office*